(12) United States Patent
Arno et al.

(10) Patent No.: US 9,088,247 B2
(45) Date of Patent: Jul. 21, 2015

(54) METHOD AND APPARATUS FOR A MULTI-STANDARD, MULTI-MODE, DYNAMIC, DC-DC CONVERTER FOR RADIO FREQUENCY POWER AMPLIFIERS

(71) Applicant: ST-Ericsson SA, Plan-les-Ouates (CH)

(72) Inventors: Patrik Arno, Sassenage (FR); Matthieu Thomas, Praha (CZ)

(73) Assignee: ST-Ericsson SA, Plan-les-Quates (CH)

( * ) Notice: Subject to any disclaimer, the term of this patent is extended or adjusted under 35 U.S.C. 154(b) by 75 days.

(21) Appl. No.: 14/056,396

(22) Filed: Oct. 17, 2013

(65) Prior Publication Data

US 2014/0232458 A1  Aug. 21, 2014

Related U.S. Application Data

(60) Provisional application No. 61/779,227, filed on Mar. 13, 2013.

(30) Foreign Application Priority Data

Feb. 15, 2013  (EP) ..................................... 13305178

(51) Int. Cl.
| | |
|---|---|
| H03F 3/189 | (2006.01) |
| H03F 1/02 | (2006.01) |
| H03F 3/24 | (2006.01) |
| H03F 3/72 | (2006.01) |
| H02M 1/00 | (2007.01) |
| H02M 3/156 | (2006.01) |

(52) U.S. Cl.
CPC .............. *H03F 3/189* (2013.01); *H03F 1/0222* (2013.01); *H03F 1/0227* (2013.01); *H03F 1/0277* (2013.01); *H03F 3/24* (2013.01); *H03F 3/72* (2013.01); *H02M 2001/0045* (2013.01); *H02M 2003/1566* (2013.01); *H03F 2200/111* (2013.01); *H03F 2200/432* (2013.01); *H03F 2200/555* (2013.01); *H03F 2203/7221* (2013.01); *H03F 2203/7236* (2013.01)

(58) Field of Classification Search
CPC ............................. H03F 1/0222; H03F 1/0233
USPC .......................................................... 330/136
See application file for complete search history.

(56) References Cited

U.S. PATENT DOCUMENTS

| | | | |
|---|---|---|---|
| 8,803,605 B2 * | 8/2014 | Fowers et al. ................. | 330/136 |
| 2005/0064830 A1 | 3/2005 | Grigore | |
| 2009/0191826 A1 | 7/2009 | Takinami et al. | |

FOREIGN PATENT DOCUMENTS

WO      2012151594 A2    11/2012

*Primary Examiner* — Steven J Mottola

(74) *Attorney, Agent, or Firm* — Coats & Bennett, PLLC

(57) ABSTRACT

A multi-mode, dynamic, DC-DC converter supplies a dynamically varying voltage, as required, from a battery to an RF power amplifier (PA). In envelope tracking mode, a fast DC-DC converter generates a dynamic voltage that varies based on the amplitude envelope of an RF signal, and regulates the voltage at the PA. A slow DC-DC converter generates a steady voltage and regulates the voltage across a link capacitor. The fast and slow converters are in parallel from the view of the PA, and the link capacitor is between the fast converter and the PA. Because different nodes are regulated, no current sharing is possible between the converters. The link capacitor boosts the dynamic voltage level, allowing a maximum dynamic voltage at the load to exceed the battery voltage. In power level tracking mode, the fast converter is disabled and the link capacitor is configured to be in parallel with the load. The slow converter directly regulates the PA, and the link capacitor is in parallel with (added to) an output capacitor. Multiple wireless network standards may be supported, allowing for the sharing of RF circuits.

11 Claims, 25 Drawing Sheets

METHOD AND APPARATUS FOR A MULTI-STANDARD, MULTI-MODE, DYNAMIC, DC-DC CONVERTER FOR RADIO FREQUENCY POWER AMPLIFIERS

This application claims priority to European Patent application 13305178.9, filed 15 Feb. 2013, and additionally to U.S. Provisional Patent application Ser. No. 61/779227, filed 13 Mar. 2013.

FIELD OF INVENTION

The present invention relates generally to power supplies, and in particular to a multi-standard, multi-mode, dynamic, DC-DC converter for RF power amplifiers.

BACKGROUND

Mobile electronic communication devices—including cellular telephones, pagers, smartphones, remote monitoring and reporting devices, and the like—have dramatically proliferated with the advance of the state of the art in wireless communication networks. Many such devices are powered by one or more batteries, which provide a Direct Current (DC) voltage. One challenge to powering electronic communication devices from batteries is that the battery does not output a stable DC voltage over its useful life (or discharge cycle) but rather the DC voltage decreases until the battery is replaced or recharged. Also, many electronic communication devices include circuits that operate at different voltages. For example, the Radio Frequency (RF) circuits of a device may require power supplied at a different DC voltage than digital processing circuits.

A DC-DC converter is an electrical circuit typically employed to convert an unpredictable battery voltage to one or more continuous, regulated, predetermined DC voltage levels, and thus to provide stable operating power to electronic circuits. Numerous types of DC-DC converters are known in the art. The term "buck" converter is used to describe a DC-DC converter that outputs a lower voltage than the DC source (such as a battery); a "boost" converter, also called a step-up, is one that outputs a higher voltage than its DC input.

Supplying power to an RF power amplifier of an electronic communication device is particularly challenging. The efficiency of an RF power amplifier varies with the RF signal amplitude. Maximum efficiency is achieved at full power, and drops rapidly as the RF signal amplitude decreases, due to transistor losses accounting for a higher percentage of the total power consumed. The loss of efficiency may be compensated by a technique known as "envelope tracking," in which the output of a DC-DC converter, and hence the voltage supplied to the power amplifier, is not constant, but is modulated to follow the amplitude modulation of the RF signal. In this manner, at any given moment, the power supplied to the RF power amplifier depends on the amplitude of the signal being amplified.

FIG. 1 depicts the relevant RF output portion of an electronic communication device 10. A battery 12 provides a battery voltage $V_{BAT}$ to an efficient, wide-bandwidth envelope-tracking power supply 14 that modulates the supply voltage of the RF power amplifier (PA) 16. The RF PA 16 outputs an amplified RF signal for transmission from the device 10 on one or more antenna 18. The modulated voltage $V_{PA}(t)$ output by the dynamic power supply 14 should be capable of tracking a rapidly varying reference voltage. As such, the power supply 14 must meet certain bandwidth specifications. The required bandwidth depends on the specifications of the network(s) in which the RF PA 16 is used. For example, the required bandwidth exceeds 1 MHz for EDGE systems (8PSK modulation), and exceeds 30 MHz for LTE20 (Long Term Evolution).

A typical waveform of the RF envelope that must be tracked is shown in FIG. 2. This modulated voltage signal has a peak value $V_{PA\_max}$ that can be higher than the battery voltage $V_{BAT}$ and an average value $V_{PA\_avg}$ that also can be higher than $V_{BAT}$ depending on the PA 16 load-line optimization. The dynamic range of the signal is limited. The minimum value $V_{PA\_min}$ is clamped (roughly at 1V) by a particular pre-distortion algorithm (referred to generically as ISO-Gain pre-distortion) that is used in envelope tracking operation in order minimize gain variations in the PA 16 linked to supply 14 modulation.

FIG. 3 depicts a block diagram of a parallel architecture 20 used in many envelope-tracking DC power supplies 14, in which a slow DC-DC converter 22 and a fast DC-DC converter 24 provide power to the RF PA 16 in parallel. The graph of FIG. 3 depicts the frequency response of the dynamic output of the slow and fast converters 22, 24—the slow converter 22 provides a higher power, but it is steady or only slowly varying; the fast converter 24 provides a lower power, but it rapidly changes over a wide range, to match the amplitude envelope of the RF signal. Parallel architectures such as this are normally used because the global efficiency can be much higher than in the case of series architectures (i.e., where a boost converter supplies a buck converter) where the total efficiency is the product of the efficiencies. Below is a mathematical analysis of the parallel architecture 20 of FIG. 3.

$$P_{OUT} = P_{OUT\_FAST} + P_{OUT\_SLOW}$$

$$I_{DC\_FAST} = \frac{P_{OUT\_FAST}}{\eta_{FAST} \cdot V_{BAT}}$$

$$I_{DC\_SLOW} = \frac{P_{OUT\_SLOW}}{\eta_{SLOW} \cdot V_{BAT}}$$

$$\eta_{TOT} = \frac{P_{OUT\_FAST} + P_{OUT\_SLOW}}{\left(\frac{P_{OUT\_FAST}}{\eta_{FAST} \cdot V_{BAT}} + \frac{P_{OUT\_SLOW}}{\eta_{SLOW} \cdot V_{BAT}}\right) \cdot V_{BAT}}$$

$$k = \frac{P_{OUT\_FAST}}{P_{OUT\_SLOW}} < 1$$

From the last two equations can be derived an equation of the total efficiency of a parallel architecture, that is not the product of fast converter 24 efficiency and slow converter 22 efficiency.

$$\eta_{TOT} = (1+k) \cdot \frac{\eta_{FAST} \cdot \eta_{SLOW}}{k \cdot \eta_{FAST} + \eta_{SLOW}}$$

Total efficiency is also function of the ratio $k = (P_{OUT\_FAST}/P_{OUT\_SLOW})$. FIGS. 4A and 4B show how, for a typical case where $\text{Eff}_{FAST} = 70\%$ and $\text{Eff}_{SLOW} = 92\%$, the total efficiency varies with $$k = \frac{P_{OUT\_FAST}}{P_{OUT\_SLOW}}.$$

Several architectures have been developed in the prior art to meet the constraint of a DC-DC converter for envelope tracking. These can be divided in two groups: series architectures and parallel architectures.

In the series architecture, a relatively high voltage is required at the RF PA 16, such as 5V, but a battery may supply a $V_{BAT}$ of only 3.6V. Accordingly, a boost (step-up) DC-DC converter is connected in series with a buck (step-down) converter. FIG. 5 depicts a boost converter supplying a high switching frequency buck converter. FIG. 6 depicts a boost converter supplying a medium switching frequency, two-phase buck converter. In both cases, the efficiency is equal to the product of the boost converter efficiency and the buck converter efficiency—each of which is less than one, hence driving down the maximum total achievable efficiency.

Due to the efficiency limitations of the series architecture, a parallel architecture is better suited for envelope tracking operation. FIG. 7 depicts a slow buck DC-DC converter 22 in parallel with a fast linear regulator 24 to modulate power to an RF PA 16, as disclosed in U.S. Patent Application Publication No. 2005/064830. The slow buck converter 22 regulates the voltage at the $V_{PA}$ node by comparing it to a DC reference voltage (or, in some cases, a filtered version of the output of the linear regulator 24) to generate a feedback signal. The fast linear regulator 24 also regulates the voltage at the $V_{PA}$ node by comparing it to the modulated reference voltage obtained by tracking the amplitude envelope of the RF signal. Since there is no boost converter in this design, the maximum voltage available is $V_{BAT}$ supplied by the battery 12. Additionally, both the slow buck converter 22 and the fast linear regulator 24 attempt to regulate voltage at the same node. This creates a competition, with some current from the fast linear regulator 24 going to the slow buck converter 22 instead of to the load, and vice-versa. This current sharing has a very large deleterious effect on efficiency.

FIG. 8 depicts a parallel architecture in which a slow boost DC-DC converter 26 is added to the architecture of FIG. 7. This allows for voltages greater than $V_{BAT}$ from the battery 12. The slow boost converter 26 is loaded by the fast linear regulator 24. Similar to the series architecture, the efficiency of this arrangement is the product of the efficiency of the slow boost converter 26 and the efficiency of the parallel combination of the fast linear regulator 24 and the slow buck converter 22, which is necessarily lower than arrangement of FIG. 7, without the slow boost converter 26. Furthermore, the current sharing problem still exists, as both the slow buck converter 22 and fast linear regulator 24 attempt to regulate voltage at the same node.

FIG. 9 depicts a parallel architecture with a slow buck DC-DC converter 22 and fast linear regulator 24, and a link capacitor $C_{FLY}$ 28. This architecture is also disclosed in U.S. Patent Application Publication No. 2005/064830. The link capacitor 28 blocks DC current sharing between the slow buck converter 22 and the fast linear regulator 24. In this architecture, the fast linear regulator 24 regulates the node $V_{PA\_FAST}$, while the slow buck converter 22 regulates the node $V_{PA}$. The addition of the fast and slow parts of the regulated power supply is imperfect, since the two regulators 22, 24 do not regulate the same node.

FIG. 10 depicts the parallel architecture of FIG. 9, with the addition of a low pass filter 30. The reference voltage for the slow buck DC-DC converter 22 is extracted from the output of the fast linear regulator 24, filtered by the low pass filter 30. The slow buck converter 22 in this architecture provides the average value of modulation.

FIG. 11A depicts a configuration taking the feedback for the fast linear regulator 24 at the regulated PA 16 node $V_{PA}$. However, this configuration is inoperative because, due to the link capacitor 28, there is no DC continuity in the loop of the fast linear regulator 24. Accordingly, as depicted in FIG. 11B, a resistor 32 is placed in parallel with the link capacitor 28. This closes the DC loop for the fast linear regulator 24. However, the same problem now exists as discussed with reference to FIG. 7: current sharing between the slow buck DC-DC converter 22 and the fast linear regulator 24 degrades the efficiency of the system.

Another problem that is common to all of the parallel architectures discussed above is the reconfiguration of the system to operate in power level tracking mode rather than envelope tracking mode. When the RF PA 16 operates at low power, the envelope tracking does not provide any benefit in terms of efficiency. As a result, the RF PA 16 can be supplied with a DC voltage that is regulated as a function of the variation of the RF average power (rather than as a function of the instantaneous variations of the RF envelope), a slowly varying quantity.

All the presented solutions need a very low capacitance output capacitor $C_{OUT}$ 69 connected to the $V_{PA}$ node in order to maximize the power efficiency of the converter 20 and to have large bandwidth. However, in power level tracking, this low capacitance is not able to filter the modulated current sunk by the PA 16 (which can be viewed as current sources sinking a variable current that varies as a function of the envelope of the RF signal). This leads to a very high voltage ripple on the $V_{PA}$ node, which is not suitable for RF applications.

For this reason, even in power level tracking mode, the architectures discussed above need to have the fast converter 24 operative in order to filter the ripple on $V_{PA}$. In this configuration the reference of the fast converter 24 is at DC. Consequently, there is a degradation in efficiency due to the additional consumption of the fast regulator 24.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a DC-DC converter is based on an association of a fast response converter and a slow response converter. The fast converter provides dynamic power to the load and the slow converter provides steady power. The steady power is preferably greater than the dynamic power, and the ratio of steady to dynamic may be optimized for particular application constraints. The converters are coupled in such a way that no current sharing is possible (i.e., no current flowing from the fast converter into the slow converter, or vice-versa) and all the power is dissipated by the load. Furthermore, the inventive DC-DC converter can produce at its output dynamic voltage levels higher than battery voltage, without the need for a dedicated boost (step-up) converter to supply the fast converter. The architecture is suitable for supplying radio frequency power amplifiers (RF PAs) operating in envelope tracking mode.

One embodiment relates to a dynamic DC-DC converter operative to provide a varying voltage to a power input node of a radio frequency (RF) power amplifier (PA) operative to amplify an RF signal. The dynamic DC-DC converter includes a slow DC-DC converter operative to convert a battery voltage to a steady or slowly varying supply voltage, and a fast DC-DC converter operative to convert the battery voltage to a dynamically varying supply voltage, in response to an amplitude envelope of the RF signal. The slow converter and fast converter are arranged in parallel as viewed by the PA power input node. The dynamic DC-DC converter includes a link capacitor interposed in series between the fast converter and the PA power input node.

Another embodiment relates to a method of operating a dynamic, DC-DC converter to provide power to a Radio Frequency (RF) power amplifier (PA) amplifying an RF output signal. The RF signal is monitored. A fast DC-DC converter is operated to convert a battery voltage to a dynamically varying supply voltage in response to an amplitude envelope of the RF signal, and to regulate the voltage at a power input node of the PA. A slow DC-DC converter is operated to convert the battery voltage to a steady or slowly varying supply voltage and to regulate a voltage drop across a link capacitor. The fast and slow converters are arranged in parallel as viewed by the PA power input node, and the link capacitor is interposed in series between the fast converter and the PA power input node.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
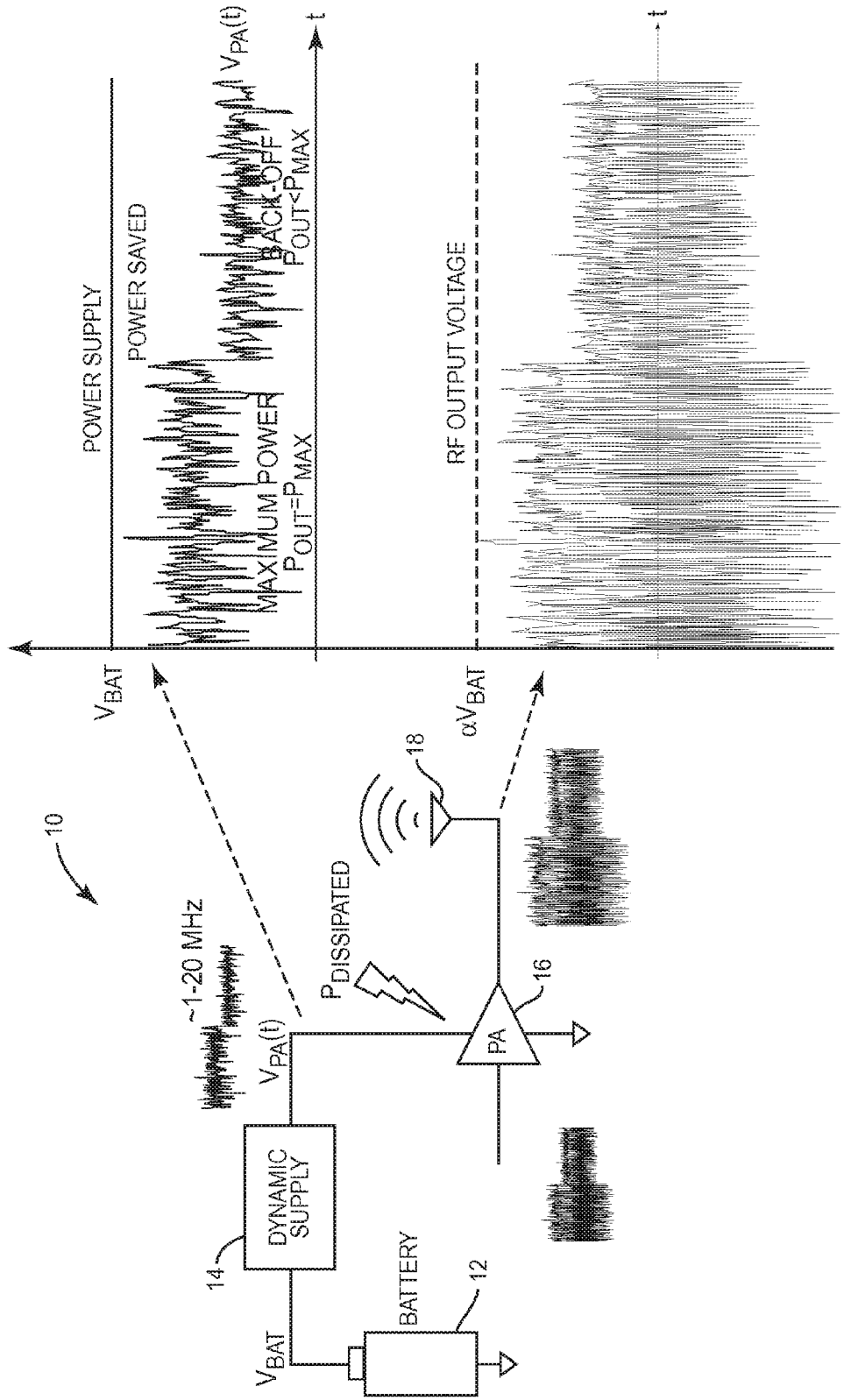
FIG. 1 is a functional block diagram of a prior art dynamic DC-DC converter and graphs depicting envelope tracking of an RF power supply.
Figure 2:
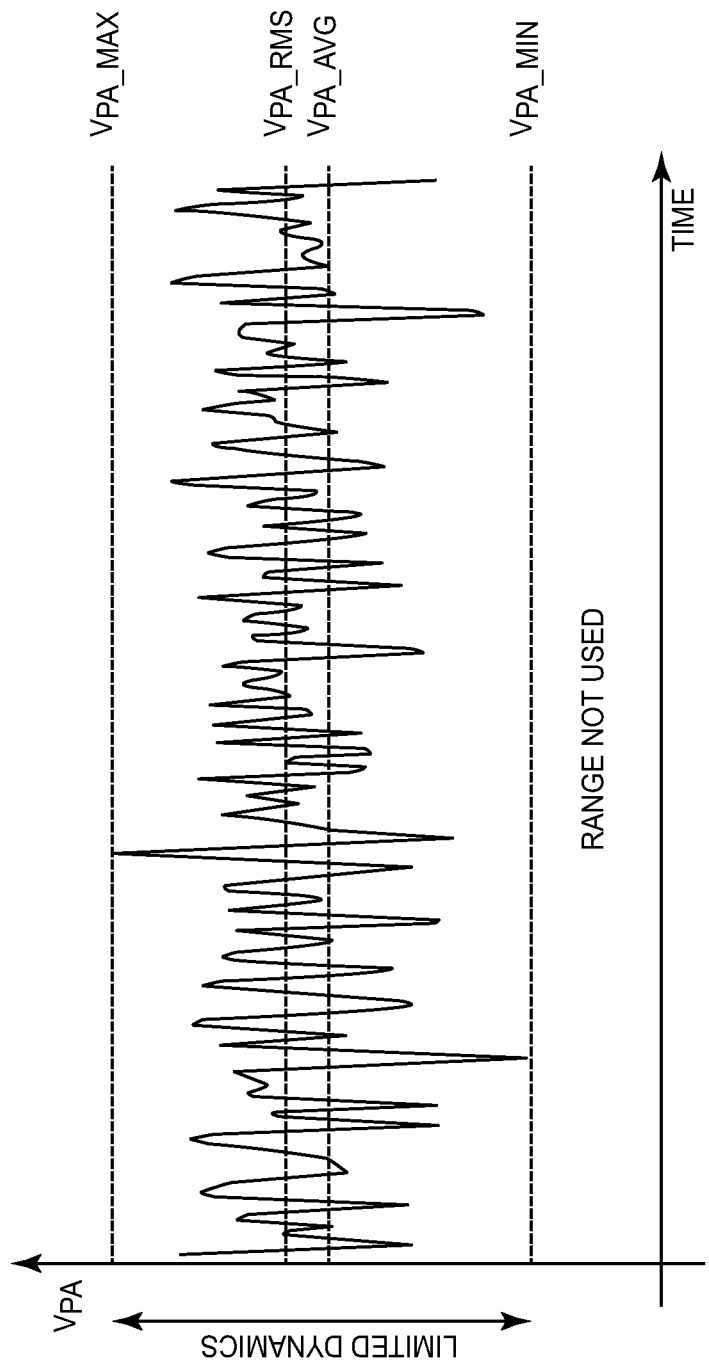
FIG. 2 is a graph depicting the dynamic voltage output of an RF power supply.
Figure 3:
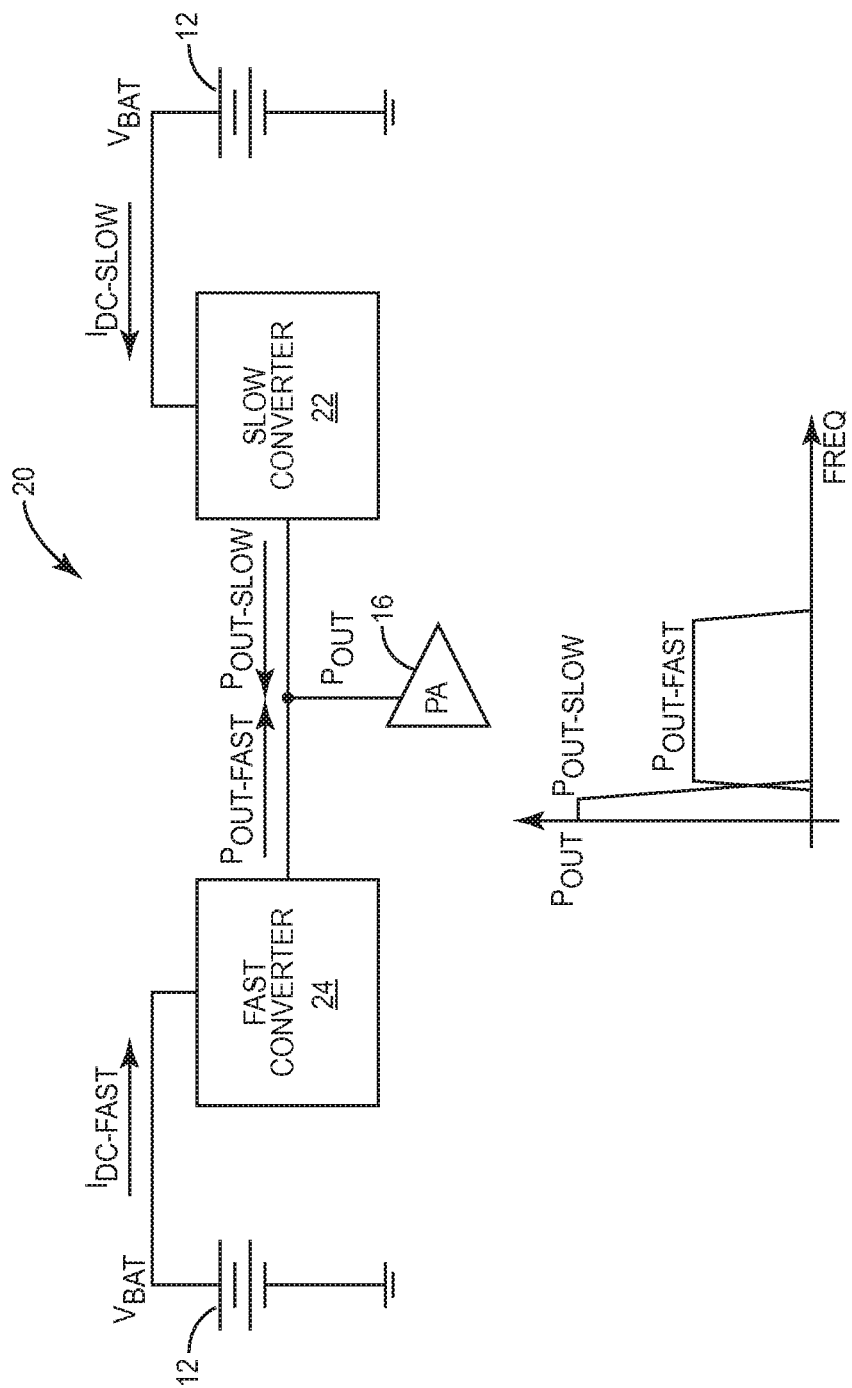
FIG. 3 is a functional block diagram and frequency graph of a prior art parallel architecture for an RF power supply.
Figure 4A:
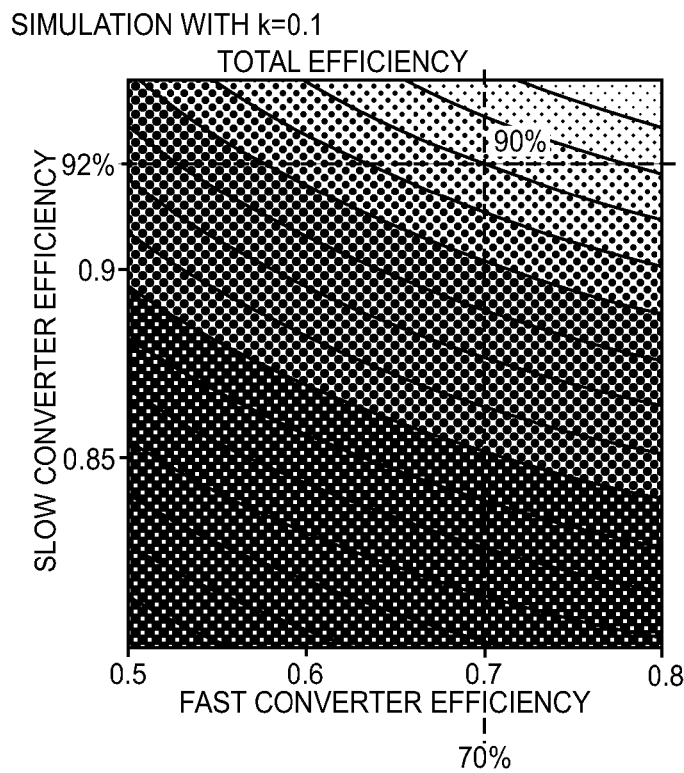
FIGS. 4A and 4B are graphs of RF power supply efficiency.
Figure 4B:
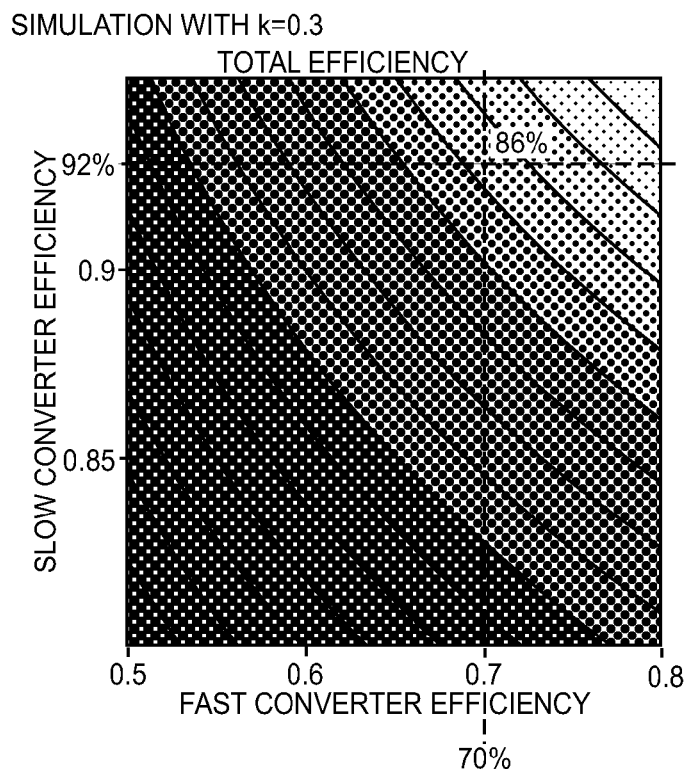
Figure 5:
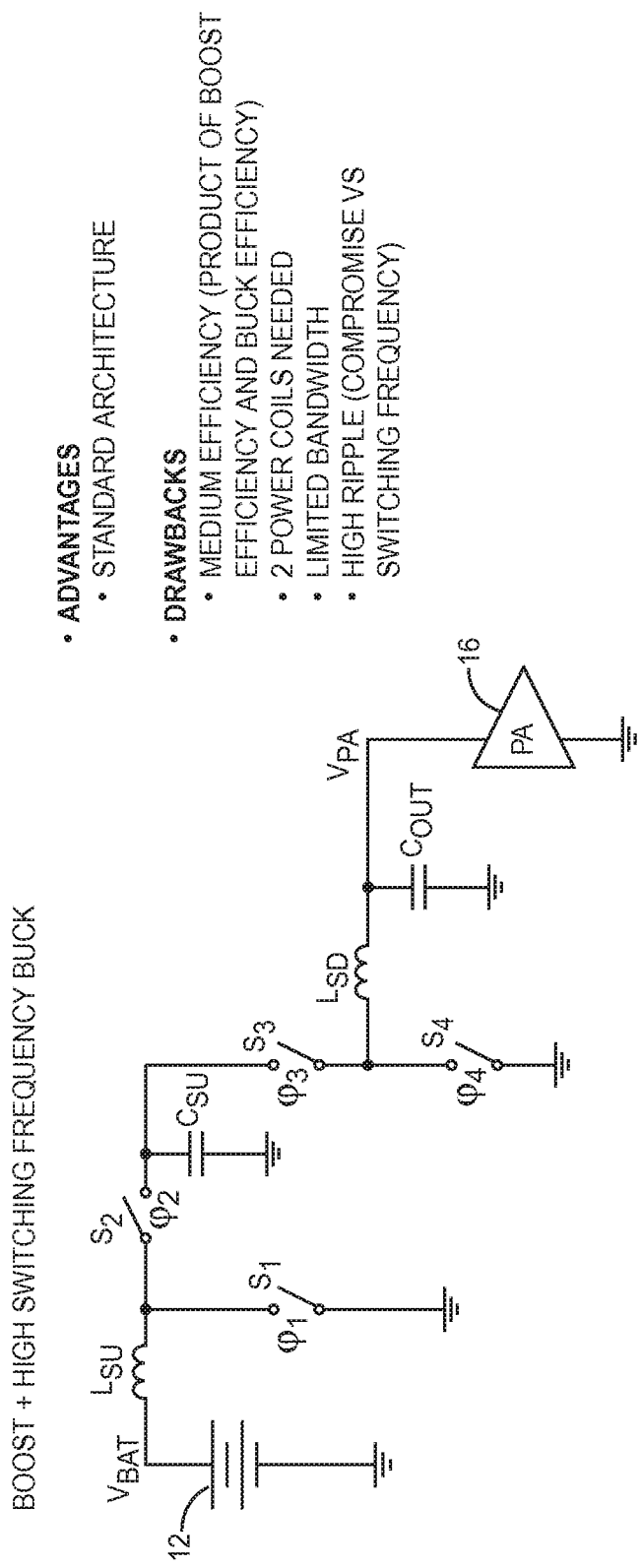
FIG. 5 is a schematic diagram of one prior art series architecture RF power supply.
Figure 6:
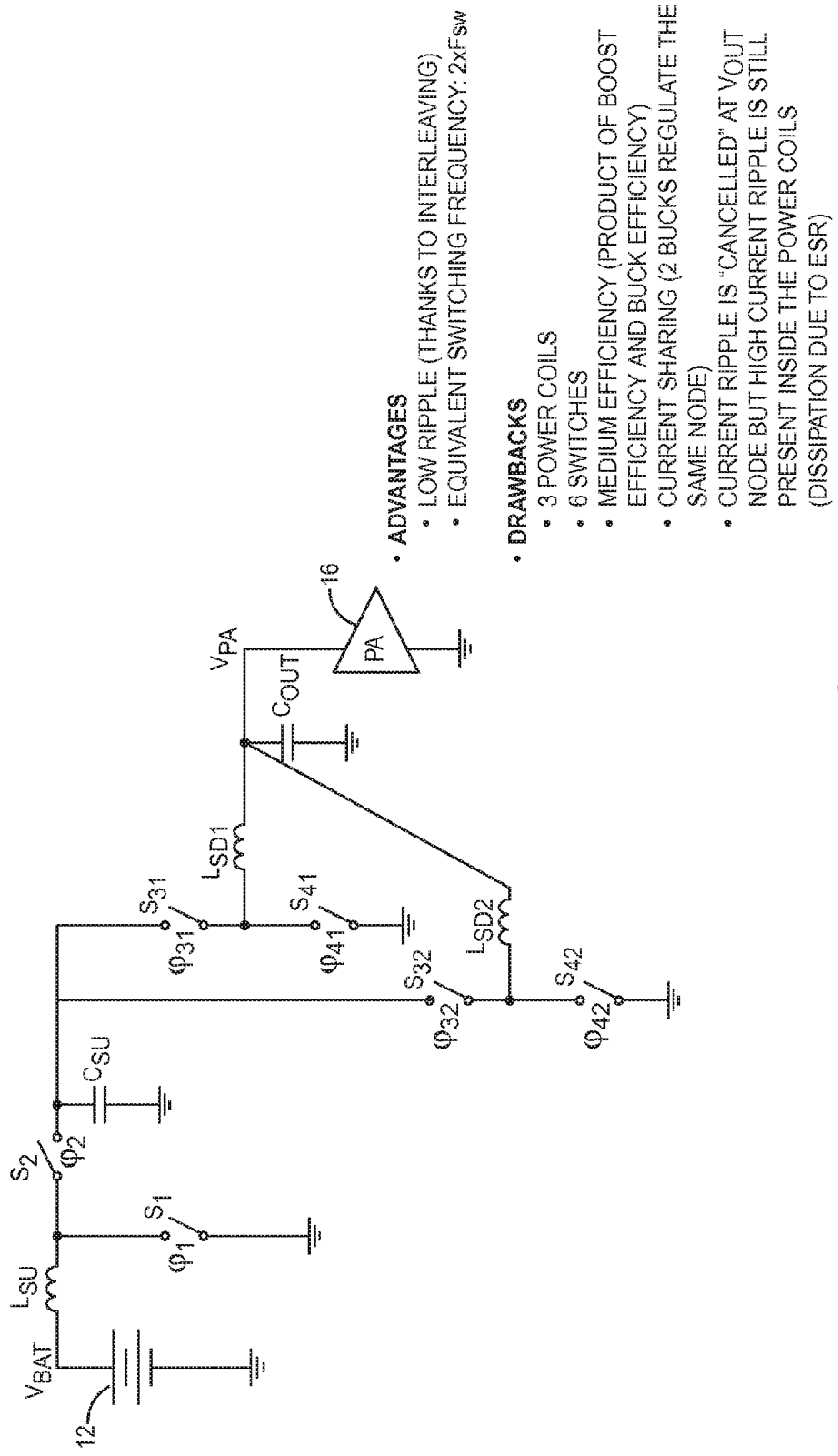
FIG. 6 is a schematic diagram of another prior art series architecture RF power supply.
Figure 7:
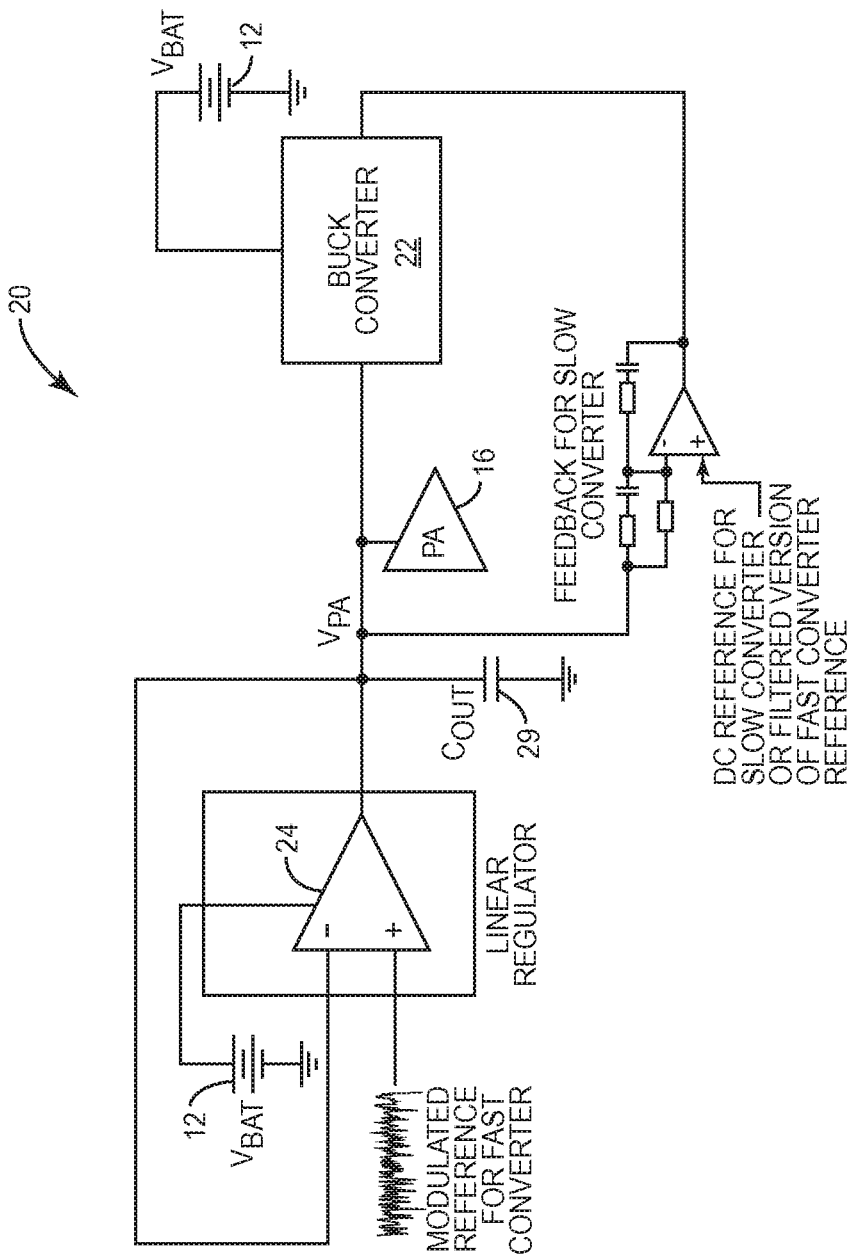
FIG. 7 is a functional block diagram of one prior art parallel architecture RF power supply.
Figure 8:
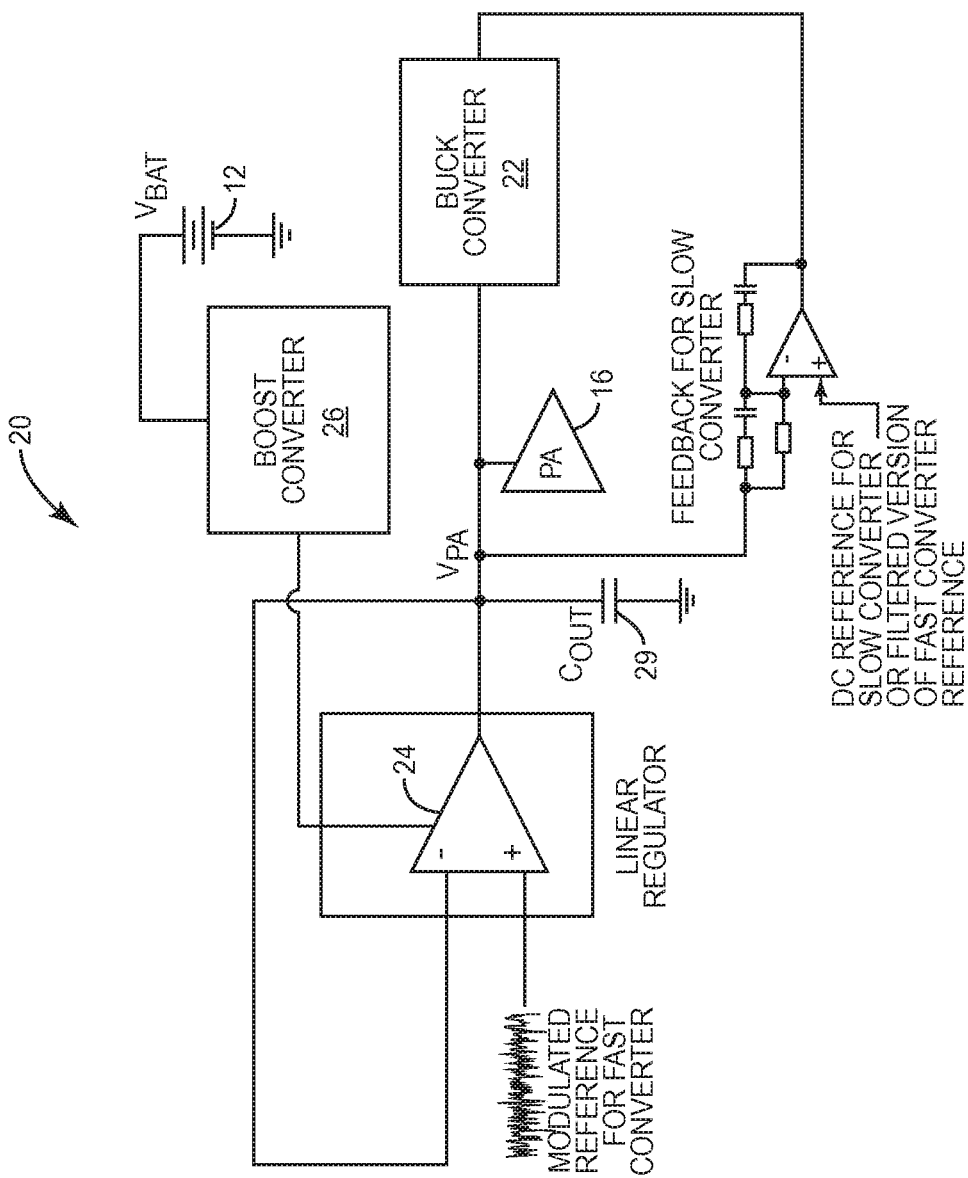
FIG. 8 is a functional block diagram of a prior art parallel architecture RF power supply with a boost converter.
Figure 9:
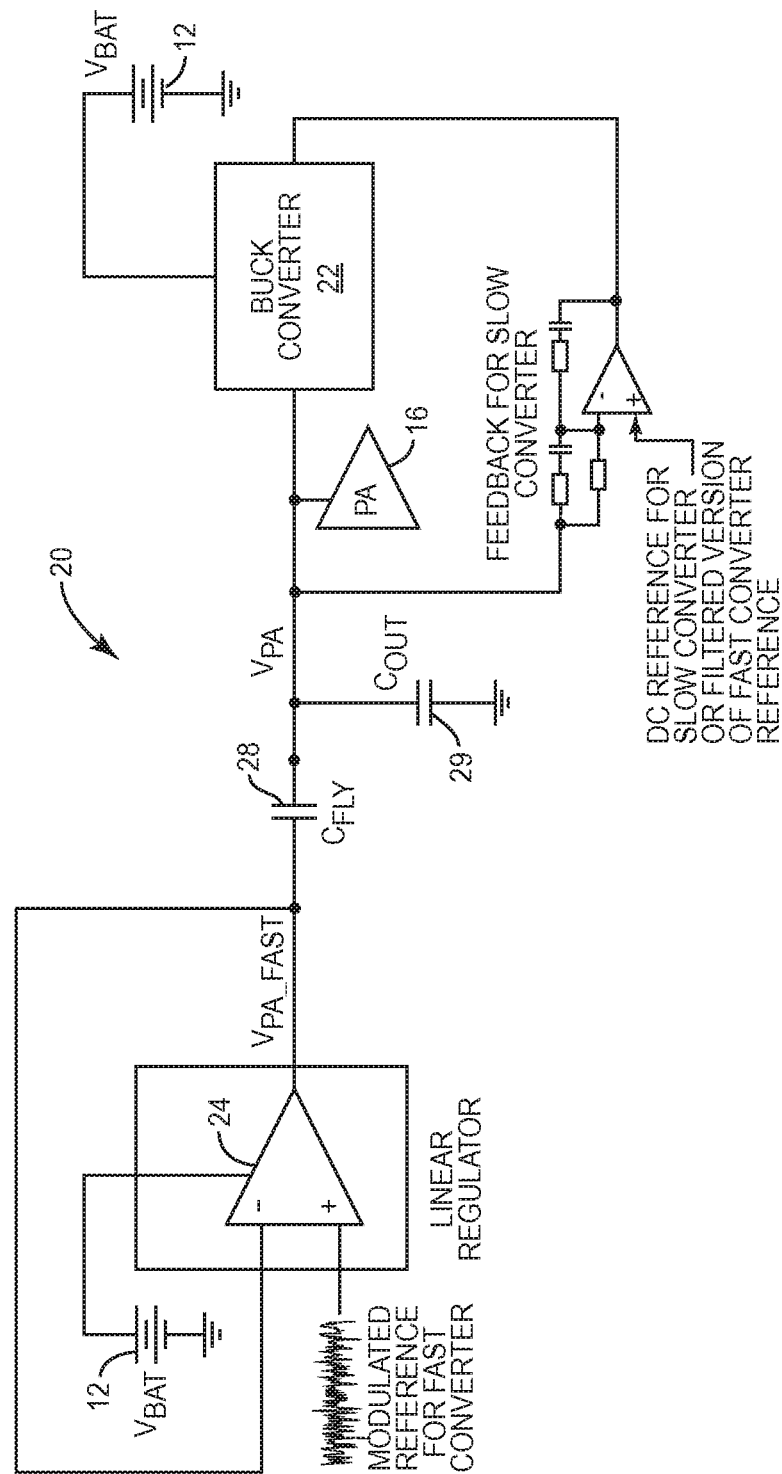
FIG. 9 is a functional block diagram of a prior art parallel architecture RF power supply with a link capacitor.
Figure 10:
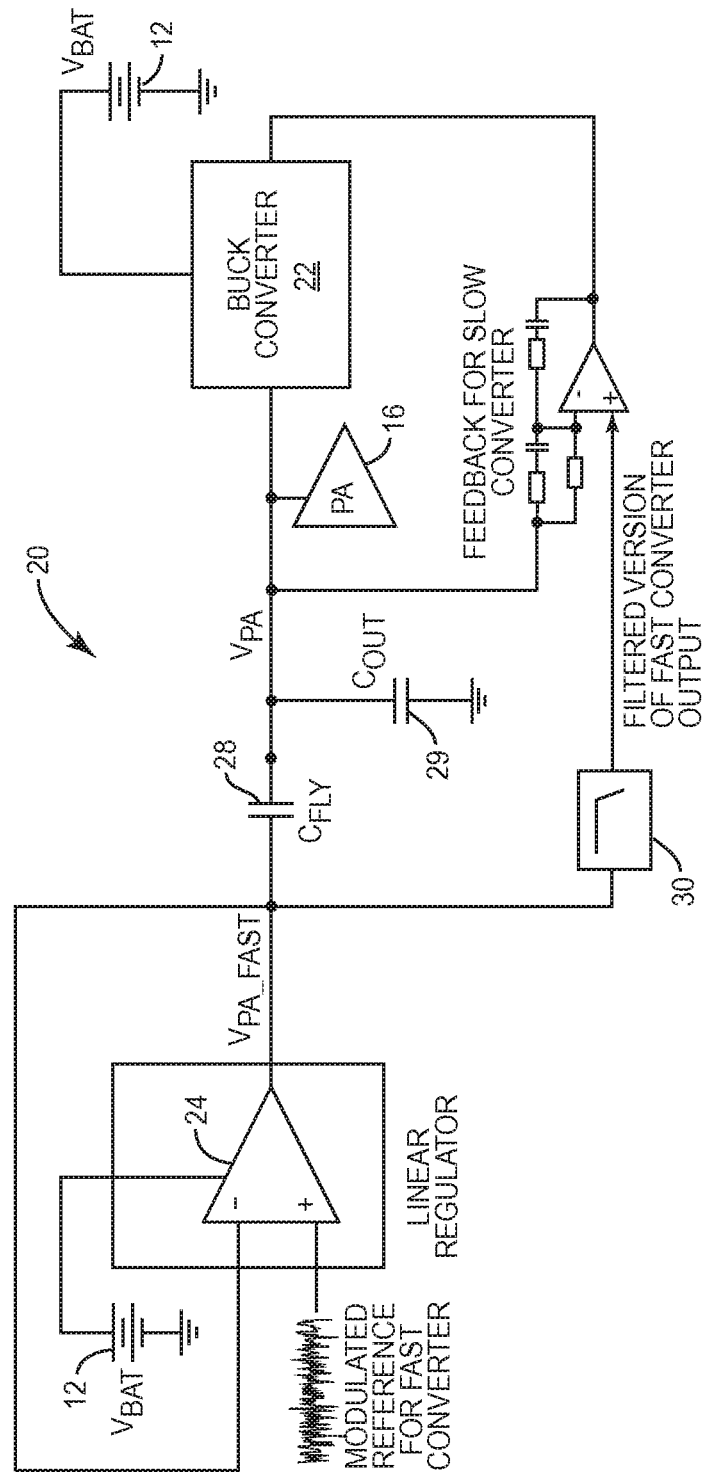
FIG. 10 is a functional block diagram of a prior art parallel architecture RF power supply with a link capacitor and a low pass filter.
Figure 11A:
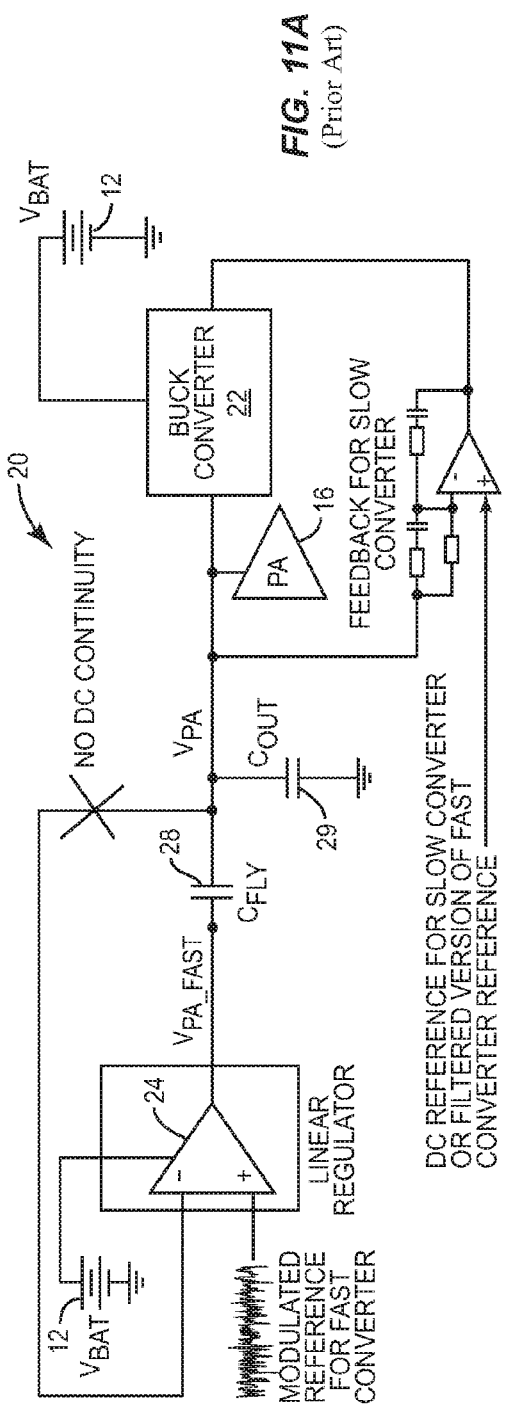
FIG. 11A is a functional block diagram of a prior art parallel architecture RF power supply without DC continuity in a fast converter loop.
Figure 11B:
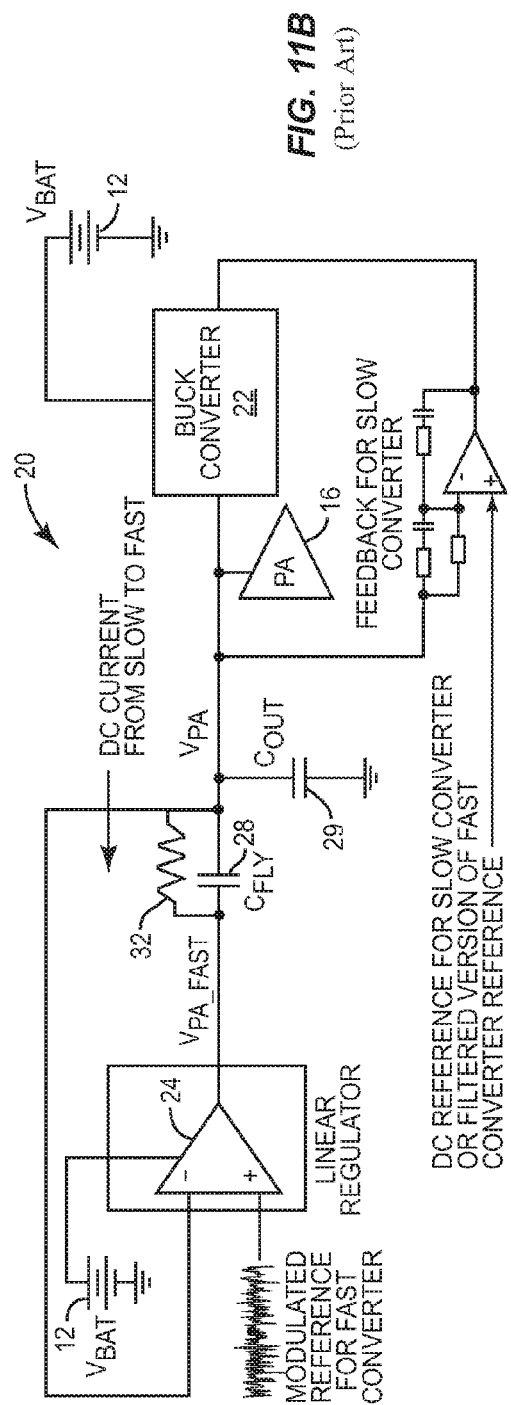
FIG. 11B is a functional block diagram of a prior art parallel architecture RF power supply with a resistor in parallel with the link capacitor.
Figure 12:
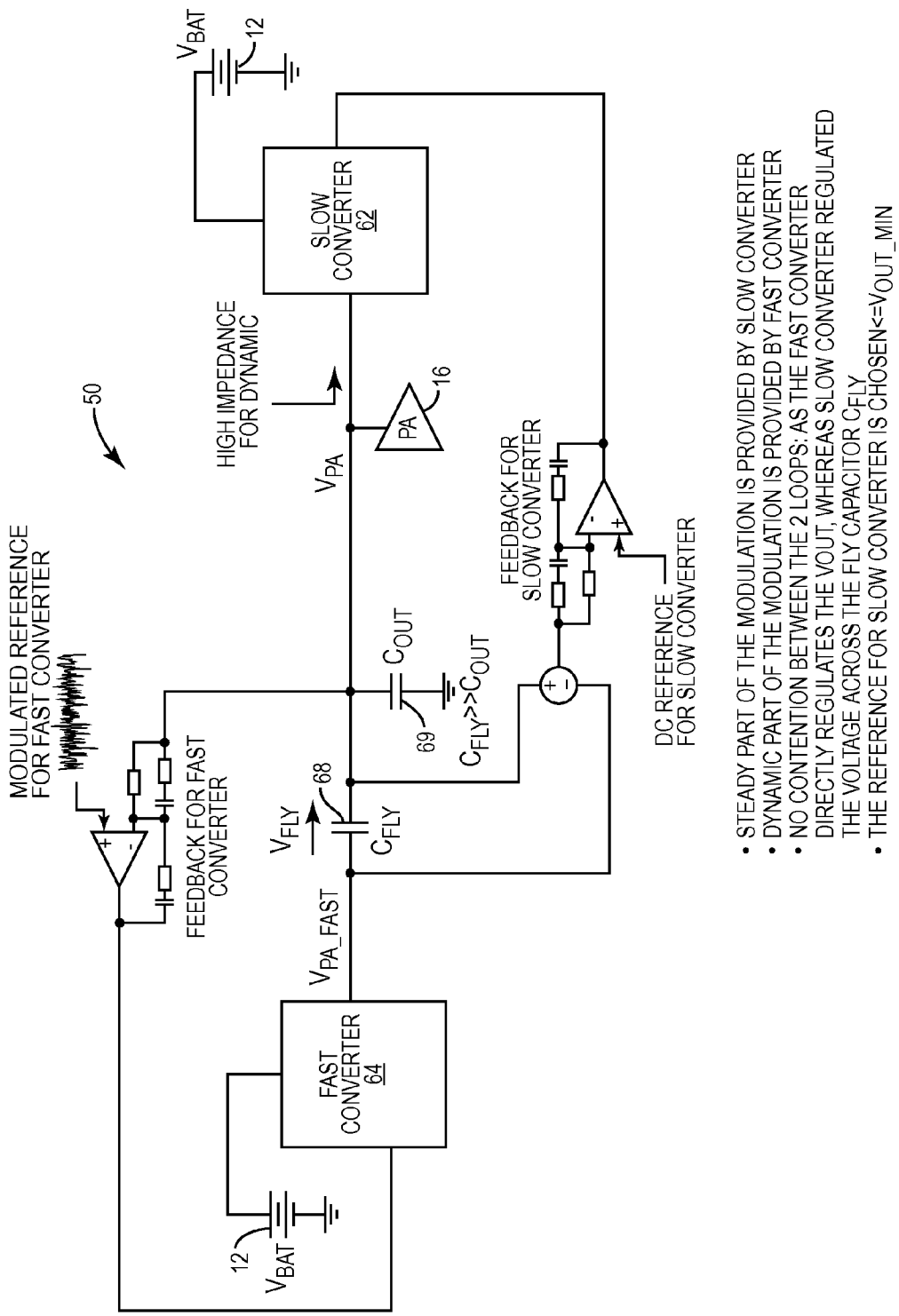
FIG. 12 is a functional block diagram of a multi-mode, dynamic, DC-DC converter according to one embodiment of the present invention.

FIG. 12 depicts a multi-mode, dynamic, DC-DC converter 50 suitable for driving an RF PA 16 from one or more batteries 12, in envelope tracking mode or power level tracking mode. The dynamic converter 50 comprises a slow DC-DC converter 62 and fast DC-DC converter 64 in parallel with the RF PA 16. A link capacitor $C_{FLY}$ 68 is interposed between the fast converter 64 and the RF PA 16—that is, the link capacitor 68 is in series with the fast converter 64 output. The feedback for the fast converter 64 is a comparison of the voltage at the regulated node $V_{PA}$ and the modulated reference voltage obtained by tracking the amplitude envelope of the RF signal. The RF signal is generated (and hence monitored) by, e.g., a baseband processor or Digital Signal Processor (DSP) not shown in the figures for clarity. Appropriate monitoring of the RF signal amplitude envelope is well within the skill of those of skill in the art. The feedback for the slow converter 62 is a comparison of the voltage drop across the link capacitor 68, i.e., $V_{PA}-V_{PA\_FAST}$, and a reference DC value (e.g., $<=V_{PA\_min}$) see FIG. 2). This guarantees that the voltage $V_{FLY}$ across the link capacitor 68 is regulated by the slow converter 62. Thus, the fast converter 64 regulates the voltage at the node $V_{PA}$, and the slow converter 62 regulates the voltage $V_{FLY}$ across the link capacitor 68. Since the two converters 62, 64 do not regulate the voltage at the same node, there is no current contention, and hence no degradation to efficiency or stability problems due to concurrent loops.

Figure 13:
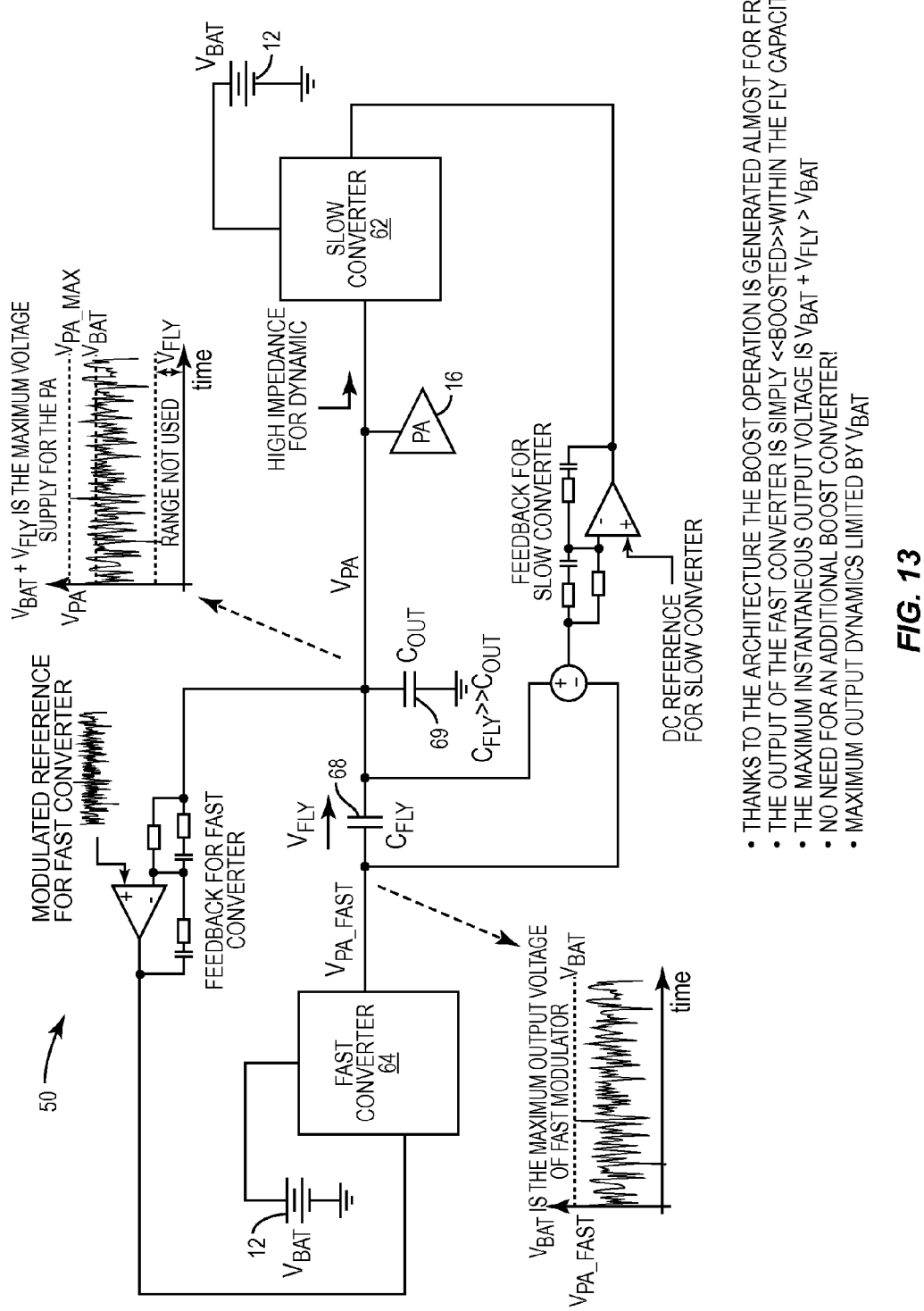
FIG. 13 is a functional block diagram of the multi-mode, dynamic, DC-DC converter of FIG. 12 with graphs depicting dynamic voltage boost.

As depicted in FIG. 13, due to the regulation of $V_{FLY}$, the voltage $V_{PA\_FAST}$ (output of the fast converter 64) is offset, or shifted up, by $V_{FLY}$. Note, with reference to FIG. 2, that there is a minimum supply voltage provided to the RF PA 16, called $V_{PA\_min}$ (approximately 1V in practice). Accordingly, if $V_{PA\_FAST}$ is in the range $0-V_{BAT}$ and if $V_{FLY}=V_{PA\_min}$ (regulated by the slow converter 64), then the maximum regulated voltage $V_{PA}$ is $V_{BAT}+V_{PA\_min}$. Thus, in envelope tracking mode, the dynamic converter 50 is able to supply voltage above the battery voltage $V_{BAT}$ without the need for a boost DC-DC converter. Note that this is possible only when providing dynamic voltage (envelope tracking mode)—the converter 50 cannot generate a DC voltage higher than $V_{BAT}$ without a boost converter. Note also that the output impedance of the slow converter 62 must be high for dynamically varying signals.

The multi-mode, dynamic, DC-DC converter 50 of FIGS. 12 and 13 works well in envelope tracking mode. However, when the PA average output power decreases, envelope tracking may be replaced with power level tracking. Since dynamic voltage level control is not necessary, the fast converter 64 may be disabled, and the slow converter 62 operated as a classic DC-DC converter, providing a steady (or slowly varying) $V_{PA}$. One problem with this configuration, however, is noise. In envelope tracking mode, the output capacitor $C_{OUT}$ 69 must be small to modulate fast changes to $V_{PA}$, to prevent excessive current. In conventional (power level tracking) mode, the small $C_{OUT}$ is insufficient to mitigate noise and reduce ripple due to the low switching frequency of the slow converter 62. In envelope tracking mode, this noise is sunk by the fast converter 64.

Figure 14:
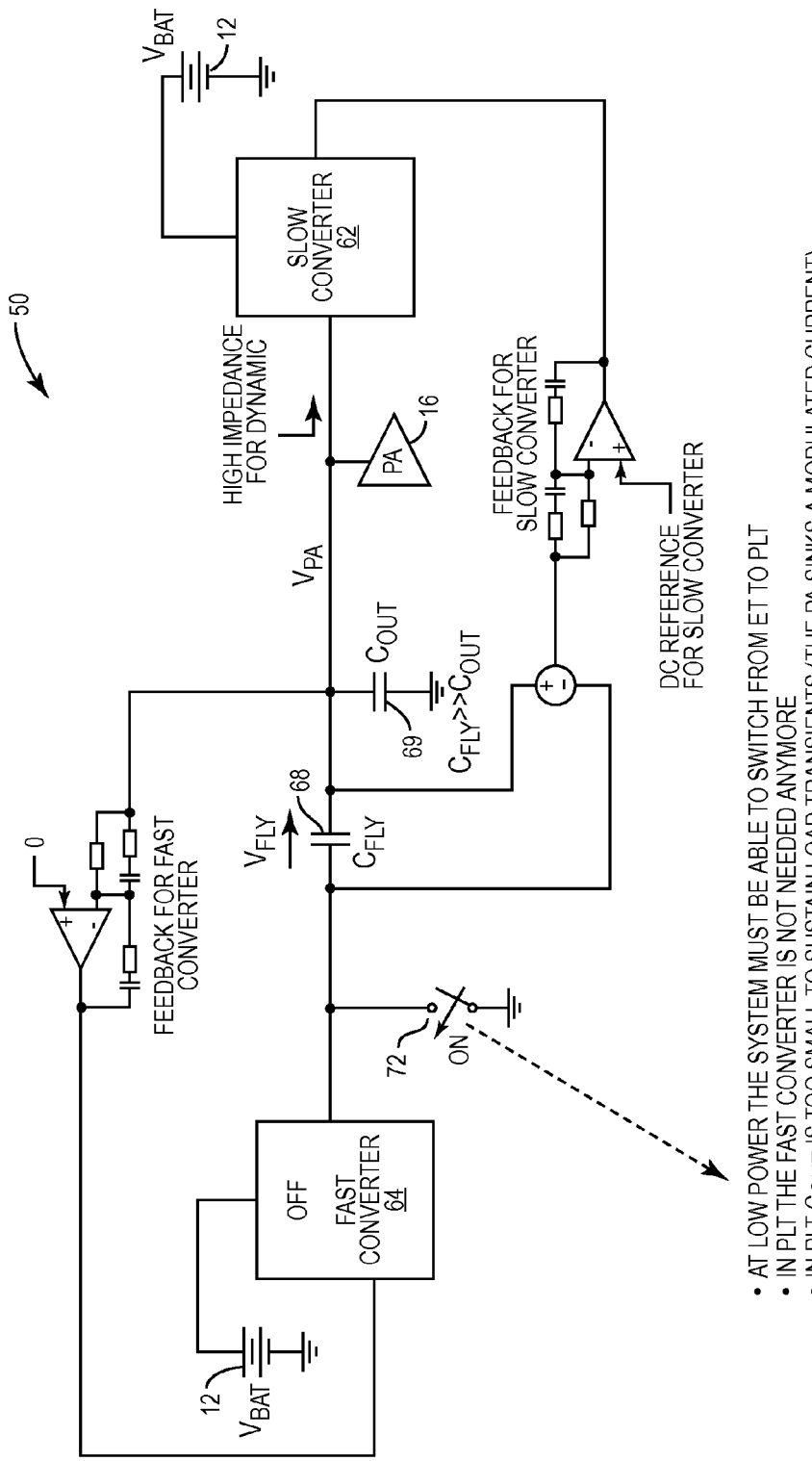
FIG. 14 is a functional block diagram of the multi-mode, dynamic, DC-DC converter of FIG. 12 in power level tracking mode.

FIG. 14 depicts a multi-mode, dynamic, DC-DC converter 50 which is similar to the converter 50 depicted in FIGS. 12 and 13, but with an additional switch 72 connecting the node between the fast converter 64 and the link capacitor $C_{FLY}$ 68 (node $V_{PA\_FAST}$) to ground. When this switch 72 is closed, and the fast converter 64 disabled, the voltage $V_{FLY}$ across the link capacitor 68 is the voltage between the node $V_{PA}$ and ground—thus, the slow converter 62 is directly regulating the PA 16 power input node $V_{PA}$. Additionally, closing the switch 72 places the link capacitor $C_{FLY}$ 68 in parallel with the output capacitor $C_{OUT}$ 69. The output capacitance, referenced to the RF PA 16, is $C_{FLY}+C_{OUT}$. In a practical implementation, values may be $C_{OUT}=2$ nF and $C_{FLY}$ in the range 500 nF-1 uF, so the increase in output capacitance is considerable. The increased output capacitance in power level tracking mode provides noise immunity and eliminates ripple in the regulated supply voltage.

Figure 15:
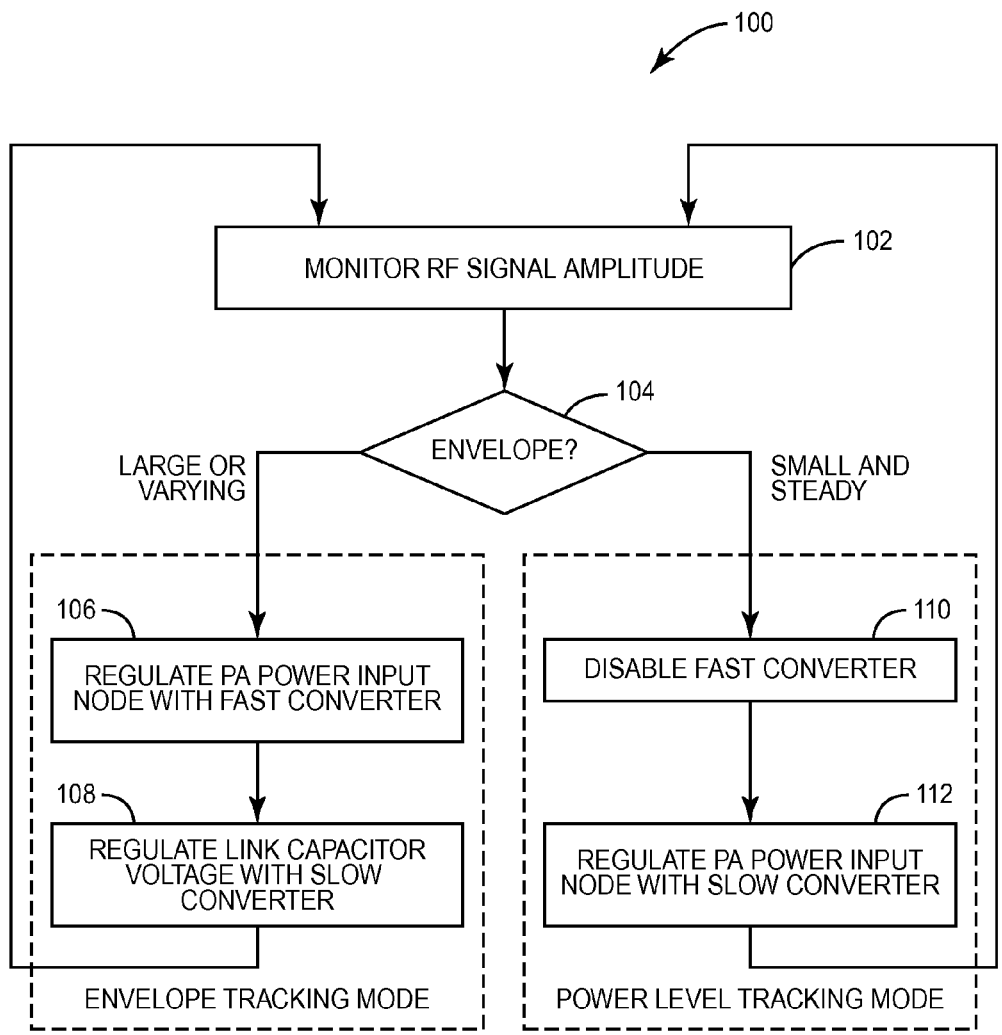
FIG. 15 is a flow diagram of a method of operating a multi-mode, dynamic, DC-DC converter.

FIG. 15 depicts a method 100 of operating a multi-mode, dynamic, DC-DC converter 50 to provide power to an RF PA 16 amplifying an RF signal. While those of skill in the art will recognize that the method is continuous and ongoing, for the purpose of explanation, it can be said to "begin" by monitoring the amplitude of an RF signal (block 102). This step may be performed, for example, by a baseband processor generating the RF signal. The envelope of the amplitude is considered (block 104). If the RF signal amplitude envelope is large and/or varying, the multi-mode, dynamic, DC-DC converter 50 operates in envelope tracking mode. In this mode, the fast converter 64 regulates the voltage at the power input node of the PA 16 (block 106) and the slow converter 62 regulates the voltage across the link capacitor 68 (block 108). In this manner, there is no degradation in efficiency due to current sharing, and the maximum voltage supplied to the PA 16 can exceed the battery voltage $V_{BAT}$ (by the link capacitor 68 voltage $V_{FLY}$). See FIG. 13. The multi-mode, dynamic, DC-DC converter 50 continues to monitor the RF output signal amplitude (block 102).

If the envelope of the RF signal amplitude is small and steady (block 104), there is no benefit in matching the power supplied to the PA 16 to the dynamics of the RF signal amplitude envelope, and the multi-mode, dynamic, DC-DC converter 50 operates in power level tracking mode. In this mode, the fast converter 64 is disabled (block 110), and the slow converter 62 regulates the voltage at the power input node of the PA 16 (block 112). In one embodiment, this is accomplished by closing a switch 72, connecting to ground the node of the link capacitor 68 opposite from the PA 16. Since the slow converter 62 regulates the voltage across the link capacitor 68, in this configuration the slow converter 62 regulates the voltage between the PA 16 power input node and ground. This additionally places the large capacitance $C_{FLY}$ in parallel with (i.e., adds it to) the output capacitance $C_{OUT}$, providing good noise immunity and eliminating ripple. See FIG. 14. The RF signal amplitude continues to be monitored (block 102).

Modern mobile electronic communication devices support multiple wireless communication network standards, such as GSM, UTMS, LTE, and the like. Such multi-standard electronic communication devices ideally employ RF circuits that can be reconfigured to operate in the various frequency bands, and capable of meeting the technical specifications, of each of the supported standards.

Figure 16A:
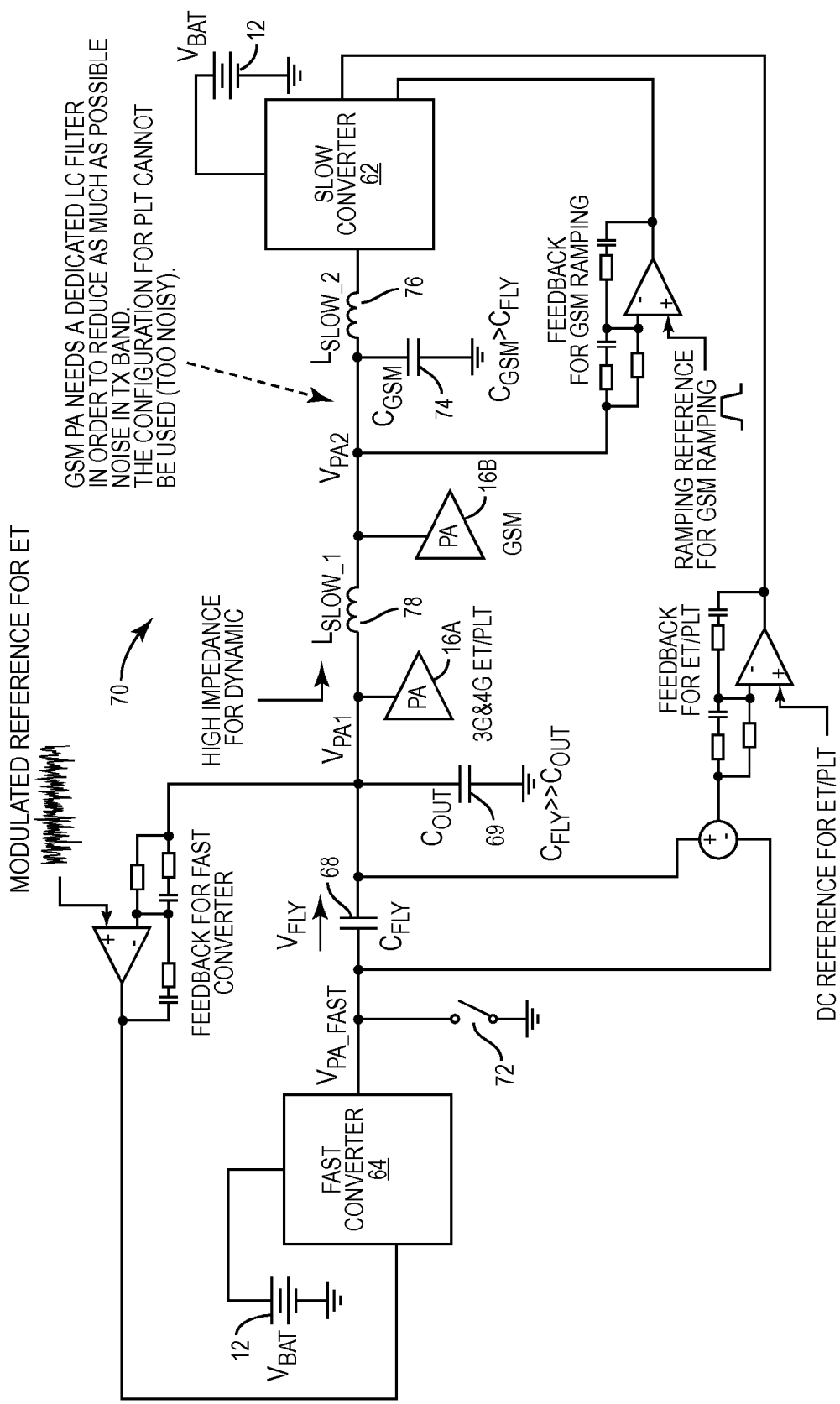
FIG. 16A is a functional block diagram of a multi-standard, multi-mode, dynamic, DC-DC converter according to one embodiment of the present invention.

FIG. 16A depicts a multi-standard, multi-mode, dynamic, DC-DC converter 70 operative to power two RF PAs. A first PA 16a is operative in a 3G/4G configuration in 3G/4G LTE networks, in both envelope tracking (ET) and power level tracking (PLT) modes. A second PA 16b is operative in a GSM configuration in 2G GSM networks. The slow converter 62 has an additional LC output filter comprising a capacitor 74 and inductor 76, and an additional feedback path taken from the second PA 16b (node $V_{PA2}$). An inductor 78 provides a high impedance for dynamic voltage changes from the fast converter 64. The capacitor 74 is large ($C_{GSM}>>C_{OUT}$).

Figure 16B:
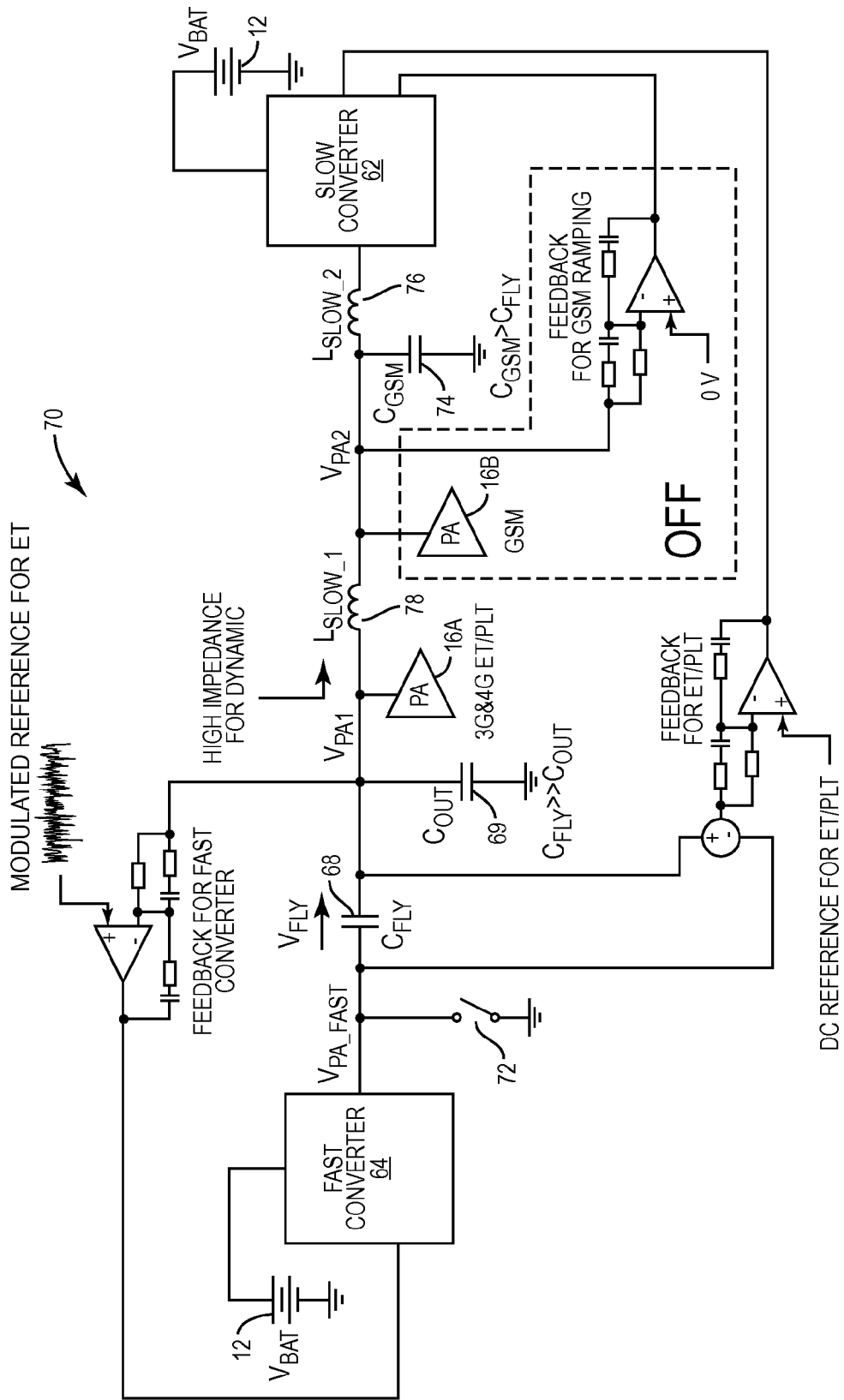
FIG. 16B is a functional block diagram of the multi-standard, multi-mode, dynamic, DC-DC converter of FIG. 16A in 3G/4G configuration.

FIG. 16B depicts the multi-standard, multi-mode, dynamic, DC-DC converter 70 in operation in the 3G/4G configuration-for example, in an LTE network. The GSM PA 16b and the GSM feedback path to the slow converter 62 are disabled. The only difference between this configuration and the converter 50 depicted in FIG. 12 is the extra LC filter on the output of the slow converter 62. In this configuration, the fast converter 64 is on, and the converter 70 provides dynamic power to the 3G/4G PA 16*a* in envelope tracking mode. As described above, for small output signals, the fast converter 64 may be turned off, and the converter 70 operated in power level tracking mode, with switch 72 closed to place the link capacitor 68 in parallel with the output capacitor 69.

Figure 16C:
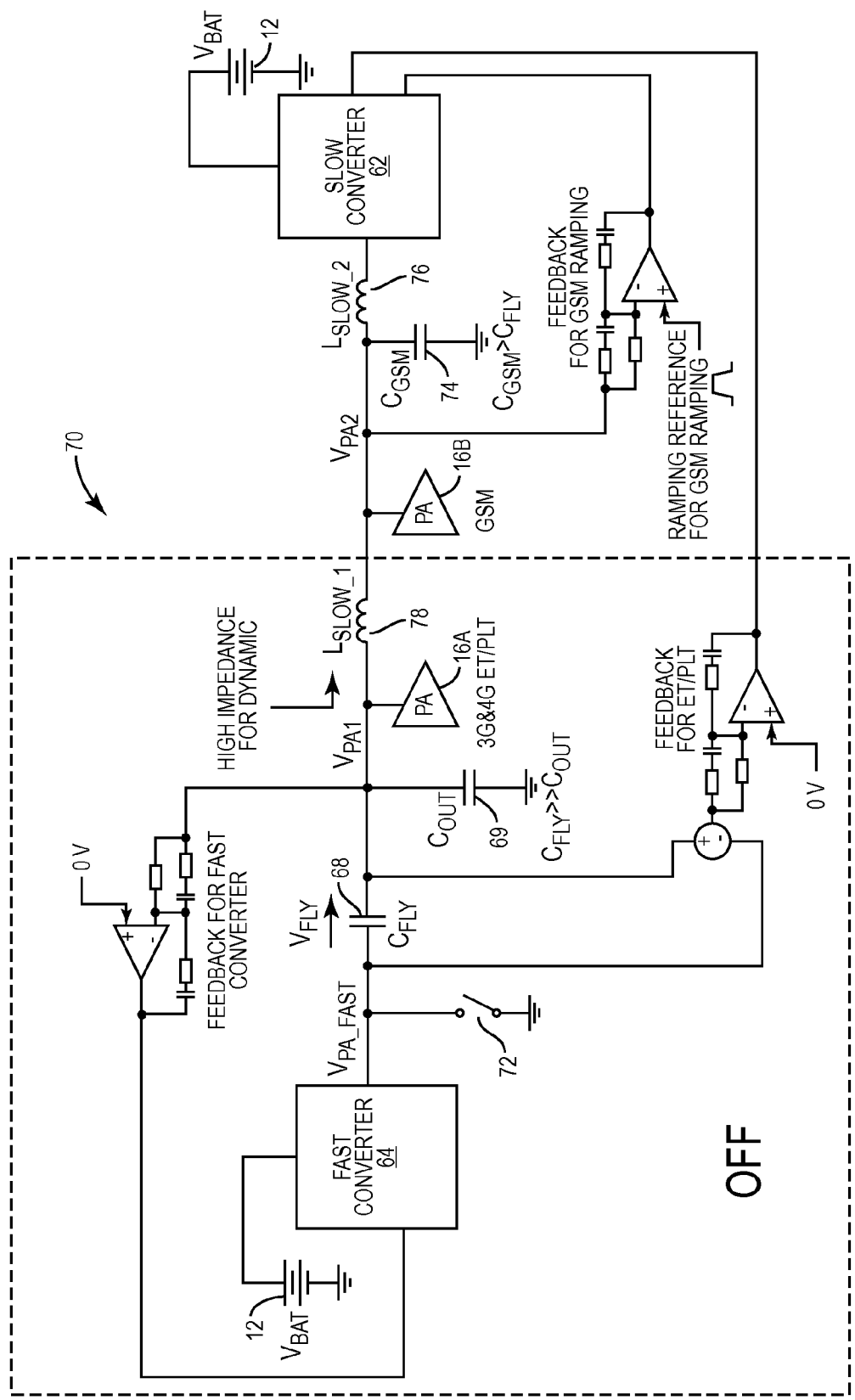
FIG. 16C is a functional block diagram of the multi-standard, multi-mode, dynamic, DC-DC converter of FIG. 16A in GSM configuration.

FIG. 16C depicts the multi-standard, multi-mode, dynamic, DC-DC converter 70 in operation in the GSM configuration—for example, in a 2G GSM network. In this configuration, the GSM PA 16*b*, slow converter 62, and output filter 74, 76 are operative. The 3G/4G PA 16*a* and the fast converter 64 loop are disabled. The GSM feedback path to the slow converter 62 regulates power to the GSM PA 16*b* (at node $V_{PA2}$).

A mobile electronic communication device employing a multi-standard, multi-mode, dynamic, DC-DC converter 70 as depicted in FIG. 16A may thus operate in either 3G/4G or GSM networks, using the same RF circuits. Those of skill in the art may readily modify the multi-standard, multi-mode, dynamic, DC-DC converter 70 as required or desired for alternate operation in other wireless communication networks, given the teachings of the present disclosure.

Different circuits can be used to implement the fast and slow converters 62, 64 in both the multi-mode, dynamic, DC-DC converter 50 (as depicted in FIGS. 17A-G), and the multi-standard, multi-mode, dynamic, DC-DC converter 70.

Figure 17A:
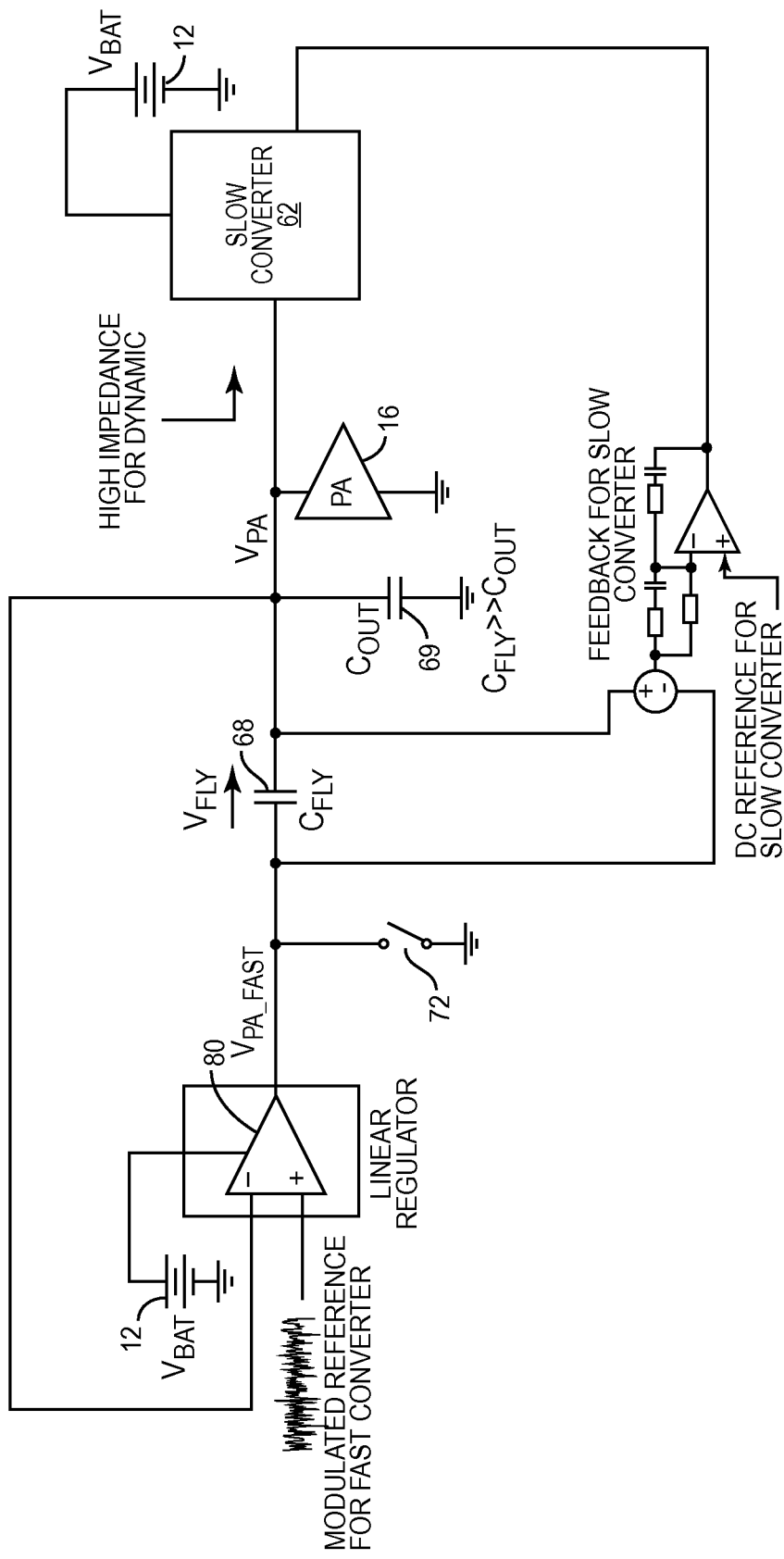
FIG. 17A is a functional block diagram of the multi-mode, dynamic, DC-DC converter of FIG. 12 in which the fast converter is implemented as a linear regulator.

For example, FIG. 17A depicts a linear regulator 80 implementing the fast converter 64.

Figure 17B:
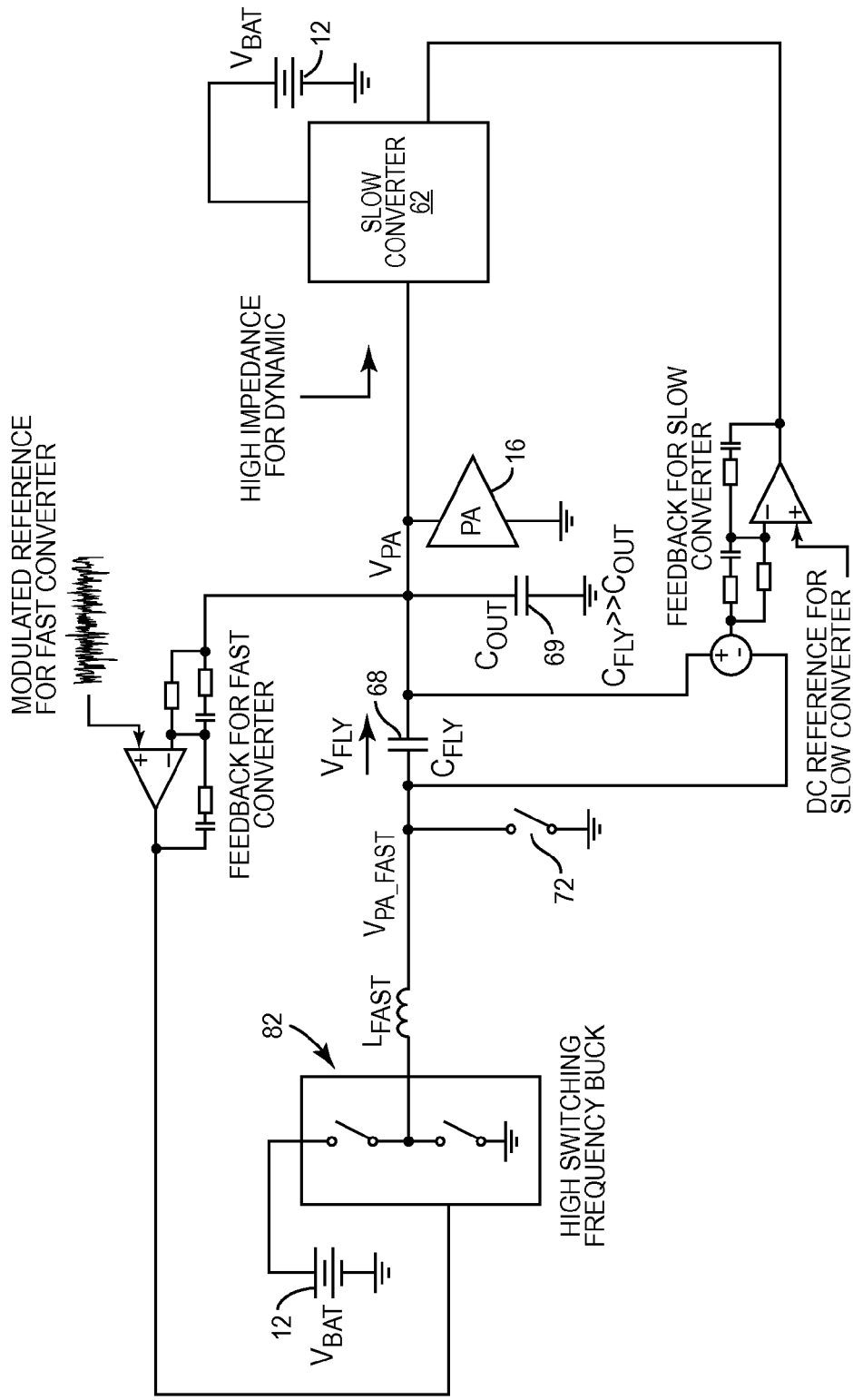
FIG. 17B is a functional block diagram of the multi-mode, dynamic, DC-DC converter of FIG. 12 in which the fast converter is implemented as a high-frequency switching buck DC-DC converter.

In FIG. 17B, the fast converter 64 comprises a high switching frequency buck DC-DC converter 82. As known in the art, such a converter may be implemented by series-connected MOS transistors, with an output inductor connected to the node between them. The transistors switch alternately, connected one side of the inductor to either the supply voltage $V_{BAT}$ or to ground. The transistor gates may be controlled by a pulse width modulated signal, generated by monitoring the output voltage or current of the converter 82 (feedback path and control not shown for clarity).

Figure 17C:
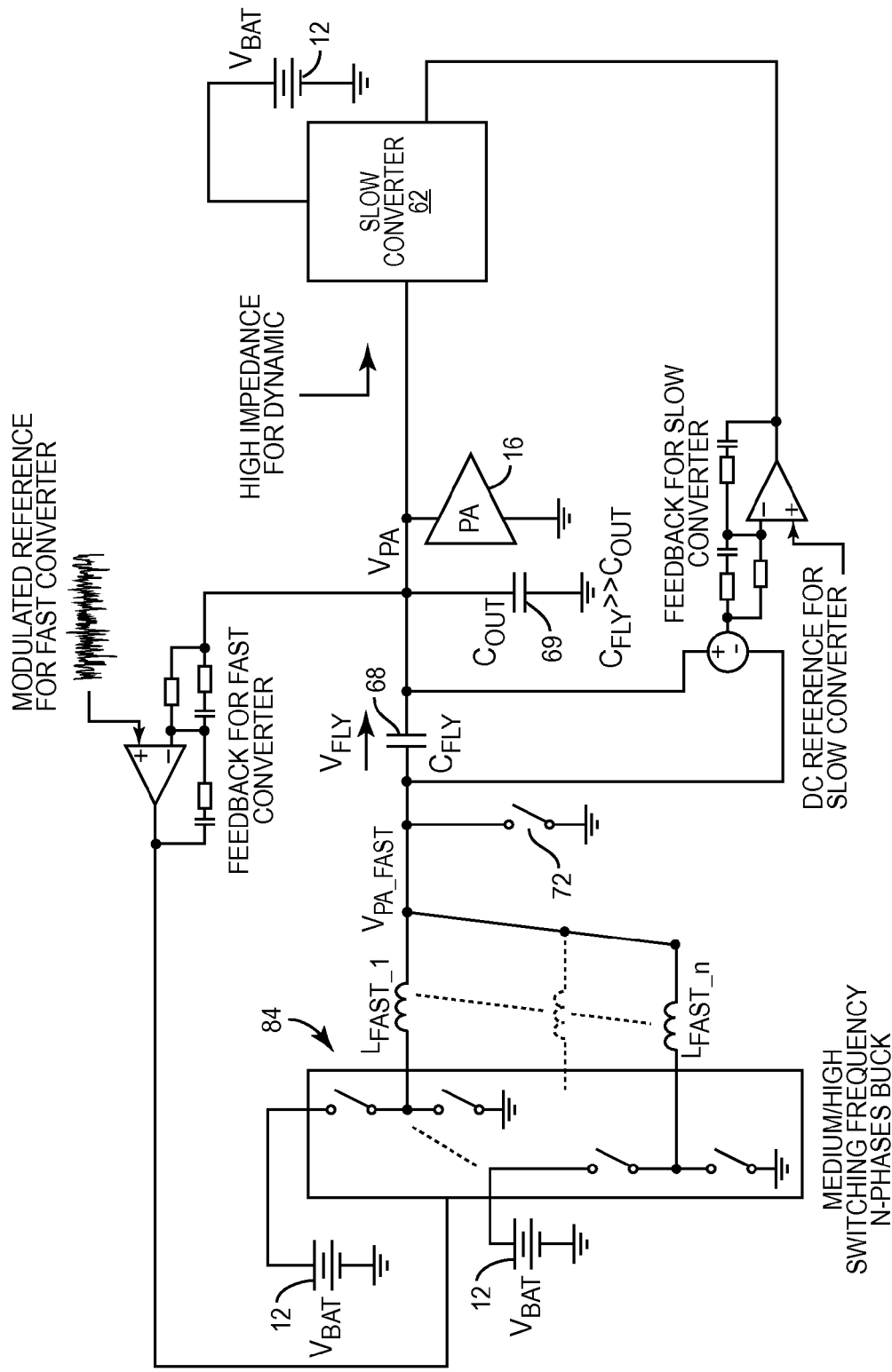
FIG. 17C is a functional block diagram of the multi-mode, dynamic, DC-DC converter of FIG. 12 in which the fast converter is implemented as a medium/high-frequency switching N-phase buck DC-DC converter.

FIG. 17C depicts the fast converter 64 implemented with a medium/high frequency N-phase buck DC-DC converter 84. Such a converter 84 comprises N sets of switching transistors and associated output inductors, with the timing of the switching between each set offset by a phase difference.

Figure 17D:
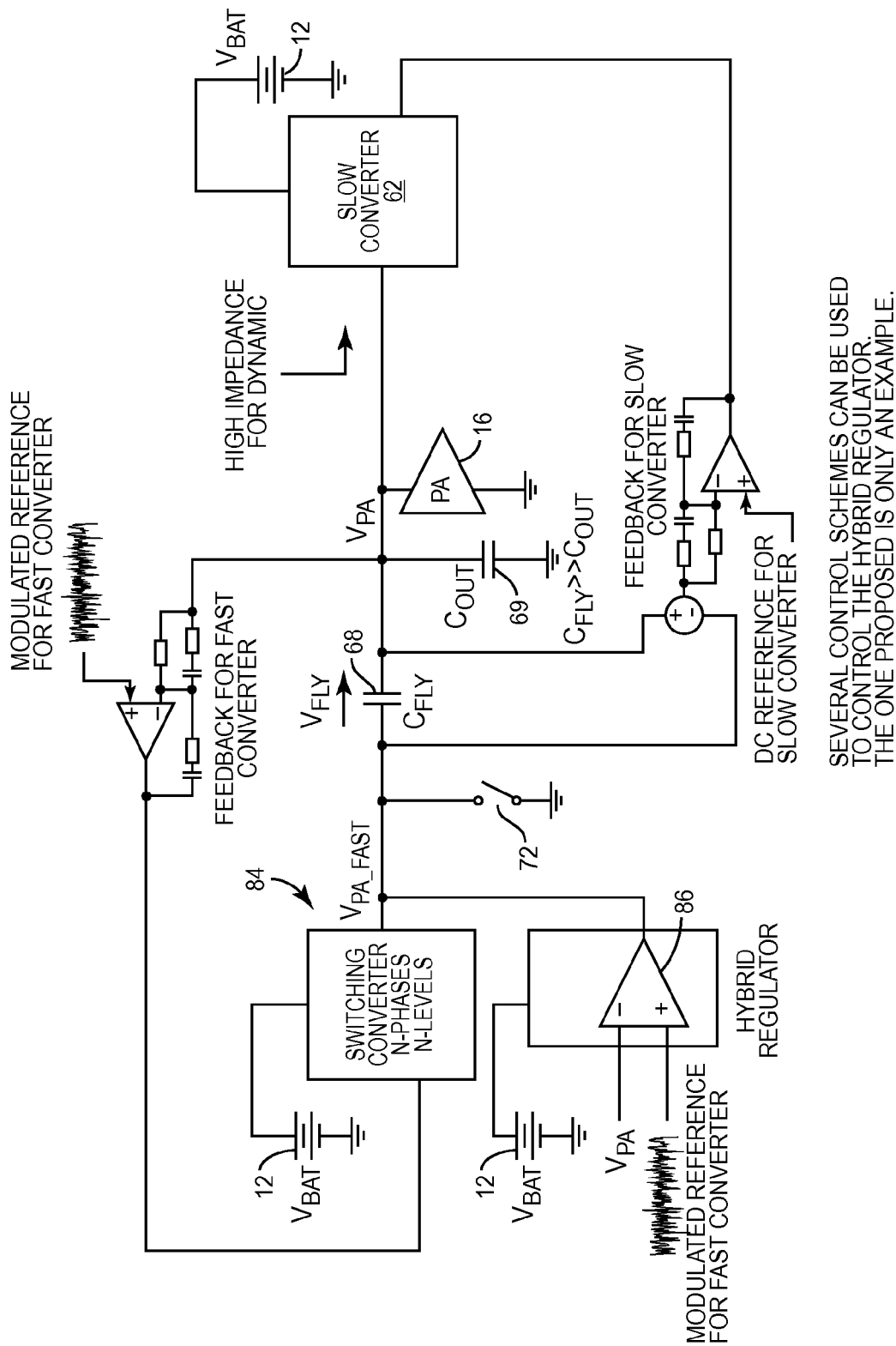
FIG. 17D is a functional block diagram of the multi-mode, dynamic, DC-DC converter of FIG. 12 in which the fast converter is implemented as a parallel combination of a switching buck converter and a linear regulator.

FIG. 17D depicts an implementation for the fast converter 64 comprising a switching buck DC-DC converter 84, which may comprise an N-phase and/or N-level converter 84, and a linear regulator 86. Both components 84, 86 receive feedback from the regulated node $V_{PA}$.

Figure 17E:
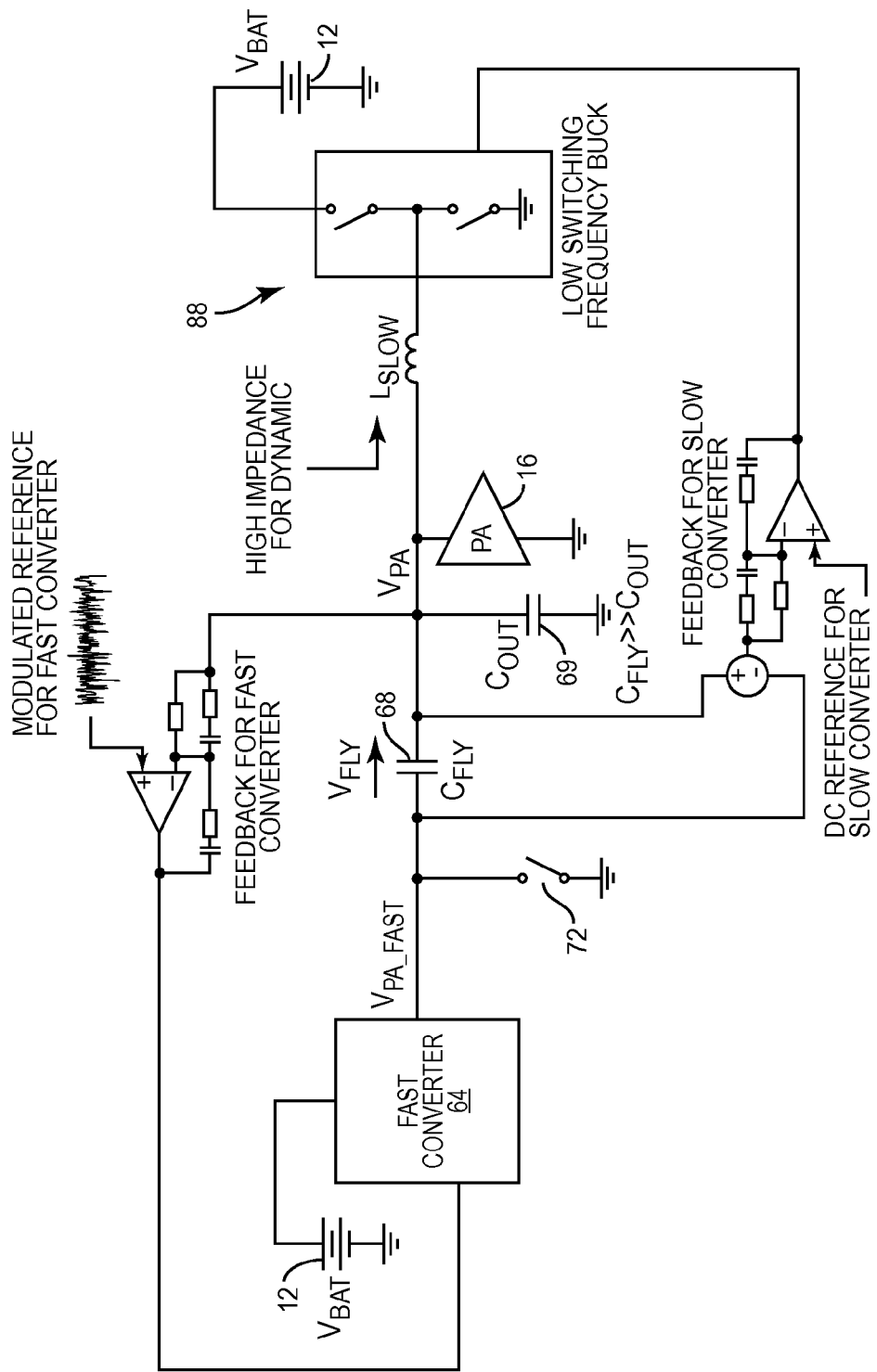
FIG. 17E is a functional block diagram of the multi-mode, dynamic, DC-DC converter of FIG. 12 in which the slow converter is implemented as a low-frequency switching buck DC-DC converter.

FIG. 17E depicts a conventional, low-frequency, switching buck DC-DC converter 88 for the slow converter 62.

Figure 17F:
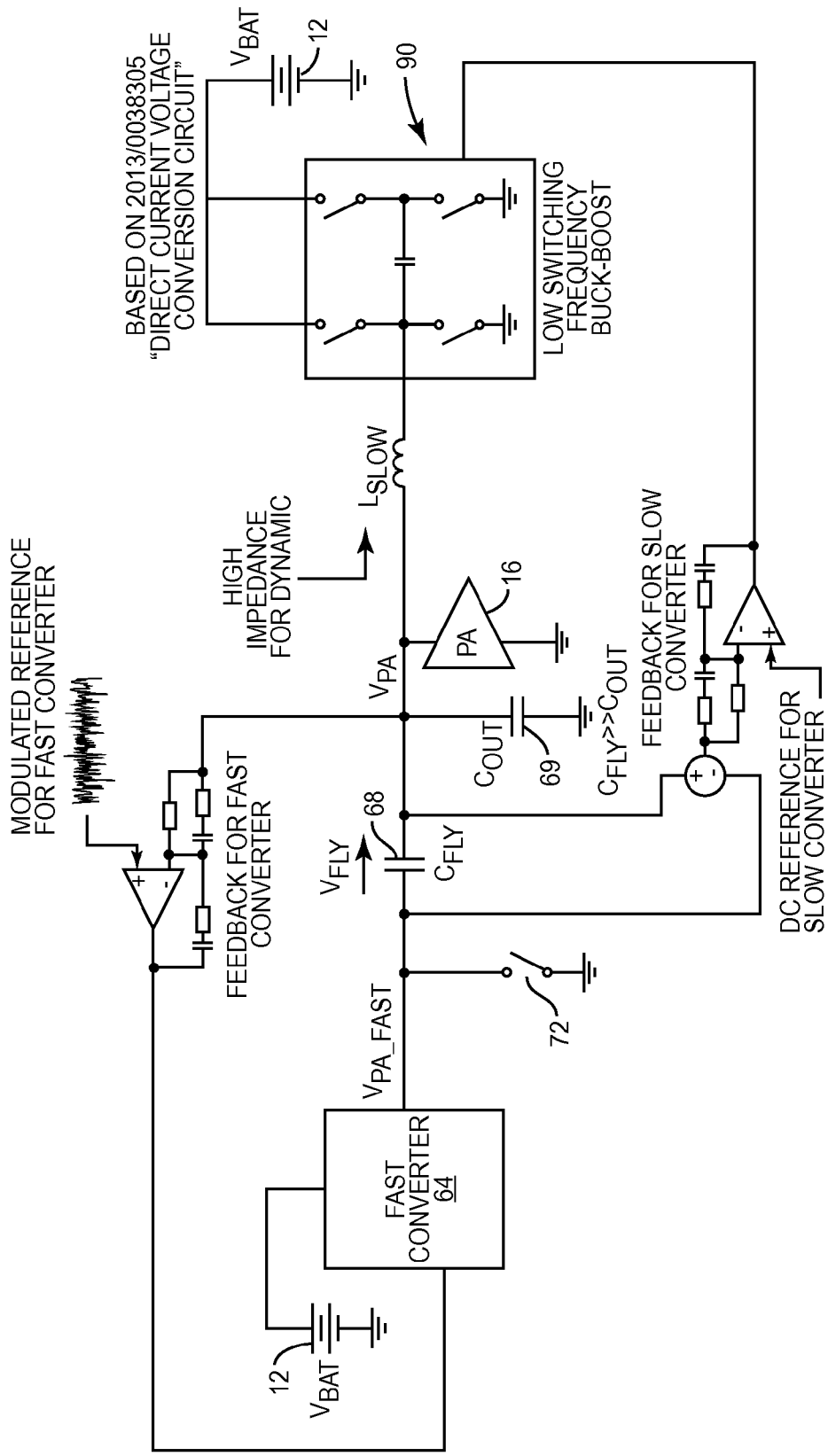
FIG. 17F is a functional block diagram of the multi-mode, dynamic, DC-DC converter of FIG. 12 in which the slow converter is implemented as a low-frequency switching buck-boost DC-DC converter.

FIG. 17F depicts the slow converter 62 implemented with a low-frequency, switching buck-boost DC-DC converter 90, as disclosed in U.S. Patent Application Publication No. 2013/0038305.

Figure 17G:
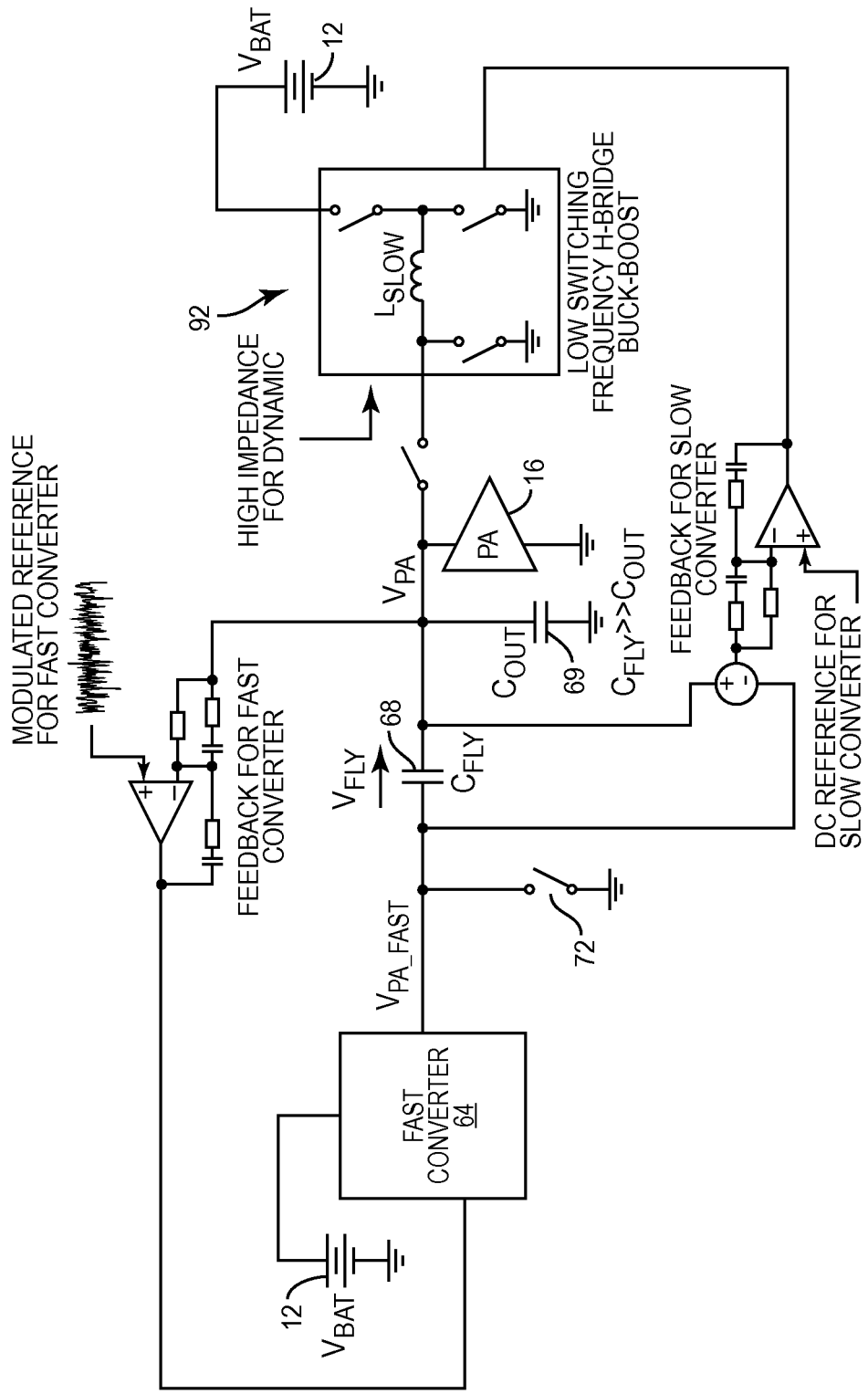
FIG. 17G is a functional block diagram of the multi-mode, dynamic, DC-DC converter of FIG. 12 in which the slow converter is implemented as a low-frequency switching H-bridge buck-boost DC-DC converter.

FIG. 17G depicts a low-frequency, switching H-bridge buck-boost DC-DC converter 92 implementing the slow converter 62.

As those of skill in the art will readily appreciate, the implementation details of FIGS. 17A-G are representative only, and are not limiting. In general, any DC-DC converter having the appropriate bandwidth, response time, and other parameters may be used to implement the slow converter 62 or fast converter 64 of the multi-mode, dynamic, DC-DC converter 50 (or multi-standard, multi-mode, dynamic, DC-DC converter 70) as described herein. Furthermore, any of the fast converter 64 implementations depicted in FIGS. 17A-D may be matched with any of the slow converter 62 implementations depicted in FIGS. 17E-G, as required or desired for any particular implementation.

Various control circuits that control the overall operation of the multi-mode, dynamic, DC-DC converter 50 (or multi-standard, multi-mode, dynamic, DC-DC converter 70) are omitted from the drawing figures for clarity, but are well known to those of skill in the art. For example, switching between envelope tracking mode and power level tracking mode may be controlled by dedicated hardware monitoring the RF signal amplitude. Alternatively, the modes may be selected by a controller or processor, and indicated, e.g., by a bit in a status register. Implementing the specific changes between the envelope tracking and power level tracking modes—for example, controlling the state of the switch 72, and enabling or disabling the fast converter 64—are well within the skill of those of ordinary skill in the electronic arts, given the teaching of the present disclosure.

The configuration (e.g., 3G/4G or GSM) of the multi-standard, multi-mode, dynamic, DC-DC converter 70, as well as the operating mode thereof (e.g., ET or PLT mode), may be selected and controlled by a processing circuit controlling the overall operation of the electronic communication device 10. Such processing circuit may comprise any sequential state machine operative to execute machine instructions stored as machine-readable computer programs in a memory, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above. The machine instructions executed on such processing circuit may be stored in any non-transient, machine-readable memory media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, etc.), or the like.

The dynamic DC-DC converters 50, 70 disclosed herein present numerous advantages over prior art implementations. The provision of both slow and fast converters 62, 64 addresses the different dynamic range regions of supply power demanded by efficient operation of an RF PA 16. In envelope tracking mode, by having the fast converter 64 regulate the PA 16 node $V_{PA}$, and the slow converter 62 regulate the voltage across a linking capacitor 68, current sharing and its concomitant deleterious effect on efficiency of operation is completely avoided. Additionally, by placing the linking capacitor 68 at the output of the fast converter 64, the regulated voltage across the linking capacitor 68 boosts the dynamic voltage delivered to the PA 16 to greater than $V_{BAT}$, without the need for a boost converter circuit. In power level tracking mode, by switching the linking capacitor 68 to ground, the slow converter directly regulates the PA 16 node $V_{PA}$ (the fast converter being disabled), and capacitance of the linking capacitor 68 is effectively added to that of the output capacitor 69 for noise immunity and to reduce ripple. Multiple wireless communication network standards may be supported by providing appropriate PAs 16*a*, 16*b*, and selectively enabling various part of the multi-standard, multi-mode, dynamic DC-DC converter 70.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A dynamic DC-DC converter operative to provide a varying DC operating voltage to a power input node of a first radio frequency (RF) power amplifier (PA) operative to amplify an RF signal, comprising:
a slow DC-DC converter operative to convert a battery voltage to a steady or slowly varying supply voltage;
a fast DC-DC converter operative to convert the battery voltage to a dynamically varying supply voltage, in response to an amplitude envelope of the RF signal;
wherein the slow converter and fast converter are arranged in parallel as viewed by the first PA power input node; and
a link capacitor interposed in series between the fast converter and the first PA power input node;
wherein a voltage drop across the link capacitor is compared to a reference voltage in a feedback loop of the slow DC-DC converter.

2. The converter of claim 1 wherein:
the fast converter is operative to regulate the voltage at the PA power input node in response to the RF signal amplitude envelope; and
the slow converter is operative to regulate a voltage across the link capacitor in response to a reference voltage.

3. The converter of claim 2 wherein the maximum value of the dynamic voltage at the first PA power input node exceeds the battery voltage by the voltage across the link capacitor.

4. The converter of claim 1 wherein the converter is a multi-mode converter operative in an envelope tracking mode to provide a dynamically varying voltage to the regulated PA power input node in response to the RF signal amplitude envelope, and further operative in a power level tracking mode to provide a steady voltage to the regulated PA power input node, the converter further comprising:
a switch operative to selectively connect a first node between the fast converter and the link capacitor to ground;
wherein in the power level tracking mode, the fast converter is disabled and the switch is operative to connect the first node to ground; and
wherein in the envelope tracking mode the fast converter is enabled and the switch is operative to isolate the first node from ground.

5. The converter of claim 4 further comprising an output capacitor connected between the first PA power input node and ground, and wherein in power level tracking mode, the switch is operative to connect the link capacitor in parallel with the output capacitor.

6. The converter of claim 2 further comprising
a second RF PA;
an LC filter interposed between the output of the slow converter and a power input node of the second RF PA; and
a feedback path from the power input node of the second PA to the slow converter;
wherein the converter is a multi-standard converter operative in a 3G/4G configuration to provide a dynamically varying voltage to the first PA power input node, and further operative in a GSM configuration to provide a steady voltage to the second PA power input node;
wherein in the 3G/4G configuration the slow converter is operative to regulate a voltage across the link capacitor; and in the GSM configuration the slow converter is operative to regulate a voltage at the second PA power input node.

7. The converter of claim 6, further comprising an inductor interposed between the power input nodes of the first and second PAs, the inductor operative to present a high impedance at the output of the slow converter to dynamically varying voltages generated by the fast converter.

8. A method of operating a dynamic, DC-DC converter to provide power to a Radio Frequency (RF) power amplifier (PA) amplifying an RF signal, comprising:
monitoring the RF signal;
operating a fast DC-DC converter to convert a battery voltage to a dynamically varying supply voltage in response to an amplitude envelope of the RF signal, and to regulate the voltage at a power input node of the PA;
operating a slow DC-DC converter to convert the battery voltage to a steady or slowly varying supply voltage and to regulate a voltage drop across a link capacitor;
wherein the fast and slow converters are arranged in parallel as viewed by the PA power input node and the link capacitor is interposed in series between the fast converter and the PA power input node.

9. The method of claim 8 wherein operating the fast and slow converters comprises generating a maximum value of the dynamically varying supply voltage at the PA power input node that exceeds the battery voltage by the voltage across the link capacitor.

10. The method of claim 8 wherein the converter is a multi-mode, dynamic, DC-DC converter further comprising a switch operative to selectively connect a first node between the fast converter and the link capacitor to ground, the method further comprising:
in an envelope tracking mode, controlling the switch to isolate the first node from ground and performing the steps of claim 8; and
in a power level tracking mode, disabling the fast converter and controlling the switch to connect the first node to ground, whereby the operating the slow DC-DC converter comprises operating the slow DC-DC converter to convert the battery voltage to a steady or slowly varying supply voltage and to regulate the voltage at a power input node of the PA.

11. The method of claim 8 wherein the converter is a multi-standard, multi-mode, dynamic, DC-DC converter further comprising a second RF PA, an LC filter interposed between the output of the slow converter and a power input node of the second RF PA, and a feedback path from the power input node of the second PA to the slow converter, the method further comprising:
operating the multi-standard, multi-mode, dynamic, DC-DC converter in a 3G/4G configuration to provide a dynamically varying voltage to the first PA power input node and operating the slow converter to regulate a voltage across the link capacitor; and
operating the multi-standard, multi-mode, dynamic, DC-DC converter in a GSM configuration to provide a steady voltage to the second PA power input node and operating the slow converter to regulate a voltage at the second PA power input node.

* * * * *